US012538442B2

(12) United States Patent
Pyo et al.

(10) Patent No.: US 12,538,442 B2
(45) Date of Patent: Jan. 27, 2026

(54) DISPLAY DEVICE

(71) Applicant: LG ELECTRONICS INC., Seoul (KR)

(72) Inventors: Jonggil Pyo, Seoul (KR); Wuram Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 214 days.

(21) Appl. No.: 18/565,769

(22) PCT Filed: Jun. 1, 2021

(86) PCT No.: PCT/KR2021/006801
§ 371 (c)(1),
(2) Date: Nov. 30, 2023

(87) PCT Pub. No.: WO2022/255507
PCT Pub. Date: Dec. 8, 2022

(65) Prior Publication Data
US 2024/0260212 A1 Aug. 1, 2024

(51) Int. Cl.
*H05K 5/02* (2006.01)
*H05K 5/03* (2006.01)

(52) U.S. Cl.
CPC ............. *H05K 5/0217* (2013.01); *H05K 5/03* (2013.01)

(58) Field of Classification Search
CPC .... G02F 1/1333; G02F 1/133308; G06F 1/16; G06F 1/1601; H05K 5/0217
See application file for complete search history.

(56) References Cited

U.S. PATENT DOCUMENTS

| | | | | |
|---|---|---|---|---|
| 11,723,160 B2 * | 8/2023 | Pyo | ......................... | G06F 1/181 361/807 |
| 2006/0291665 A1 * | 12/2006 | Tsuiki | ..................... | H04S 3/002 381/17 |
| 2009/0225239 A1 * | 9/2009 | Osada | .................... | H04R 1/028 348/841 |
| 2022/0039275 A1 * | 2/2022 | Kang | .................... | G06F 1/1603 |

FOREIGN PATENT DOCUMENTS

| | | |
|---|---|---|
| KR | 10-0495216 B1 | 6/2005 |
| KR | 10-2015-0031525 A | 3/2015 |
| KR | 10-2020-0114329 A | 10/2020 |
| KR | 10-2020-0114337 A | 10/2020 |

* cited by examiner

*Primary Examiner* — Sagar Shrestha
(74) *Attorney, Agent, or Firm* — Birch, Stewart, Kolasch & Birch, LLP

(57) ABSTRACT

A display device is disclosed. The display device of the present disclosure includes: a module cover; a display panel coupled to the module cover at a front of the module cover; an outer frame surrounding a side surface of the module cover; a guide frame elongated and disposed behind the module cover adjacent to the outer frame; and a cover assembly disposed in front of the display panel, and coupled to the guide frame to be movable in a longitudinal direction of the guide frame, wherein the guide fame is coupled to the outer frame and the module cover.

15 Claims, 27 Drawing Sheets

[FIG. 1]
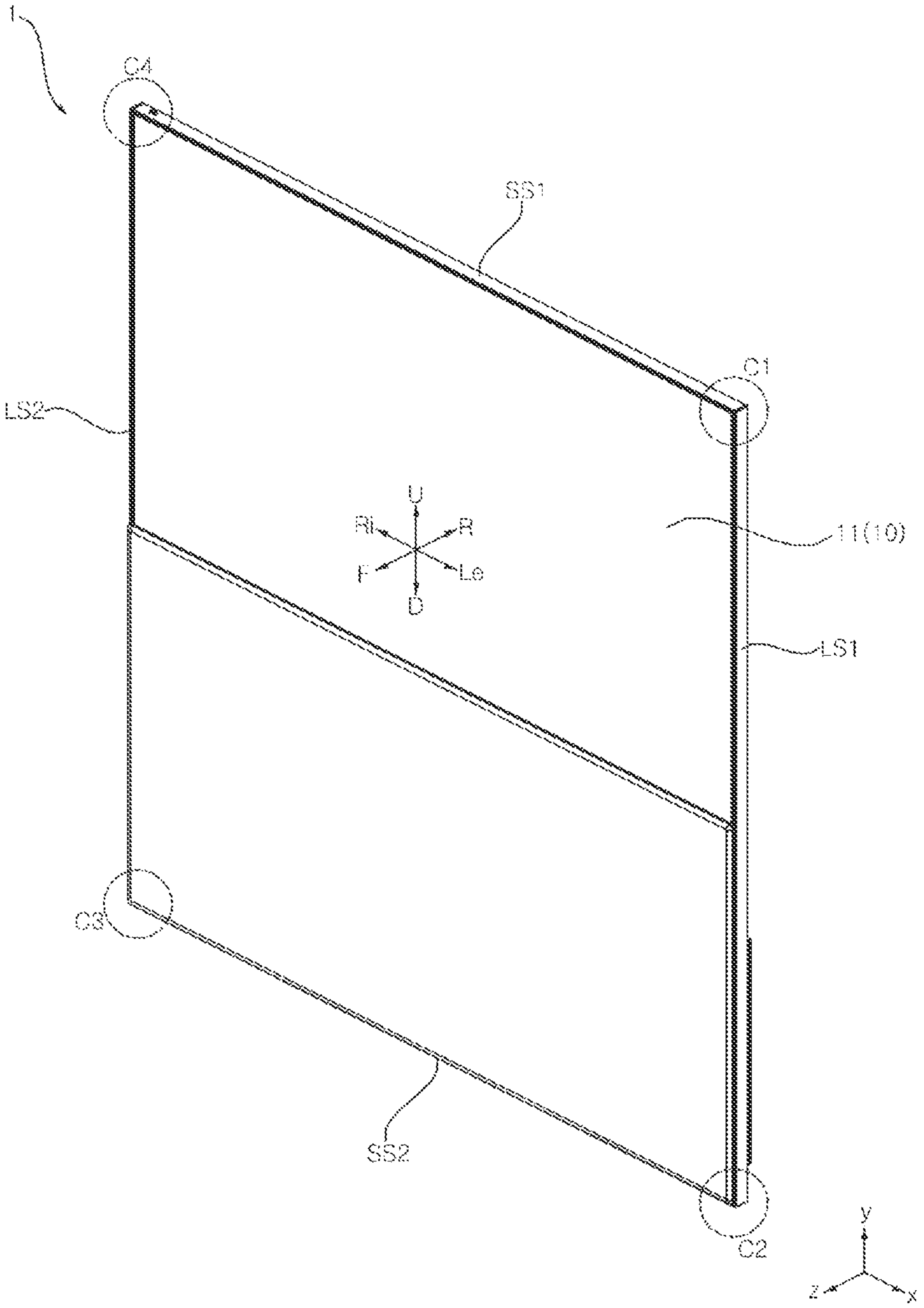

[FIG. 2]
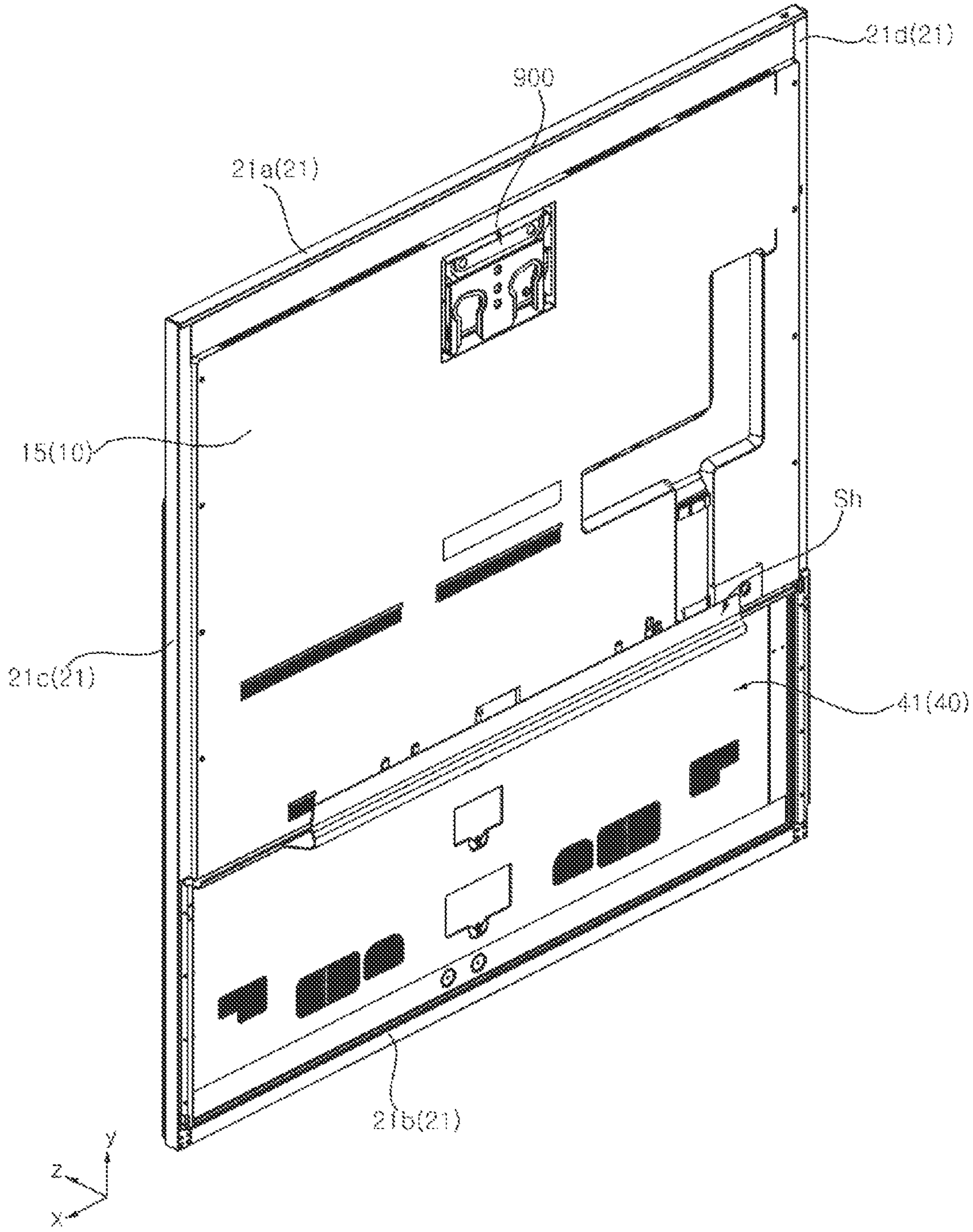

[FIG. 3]
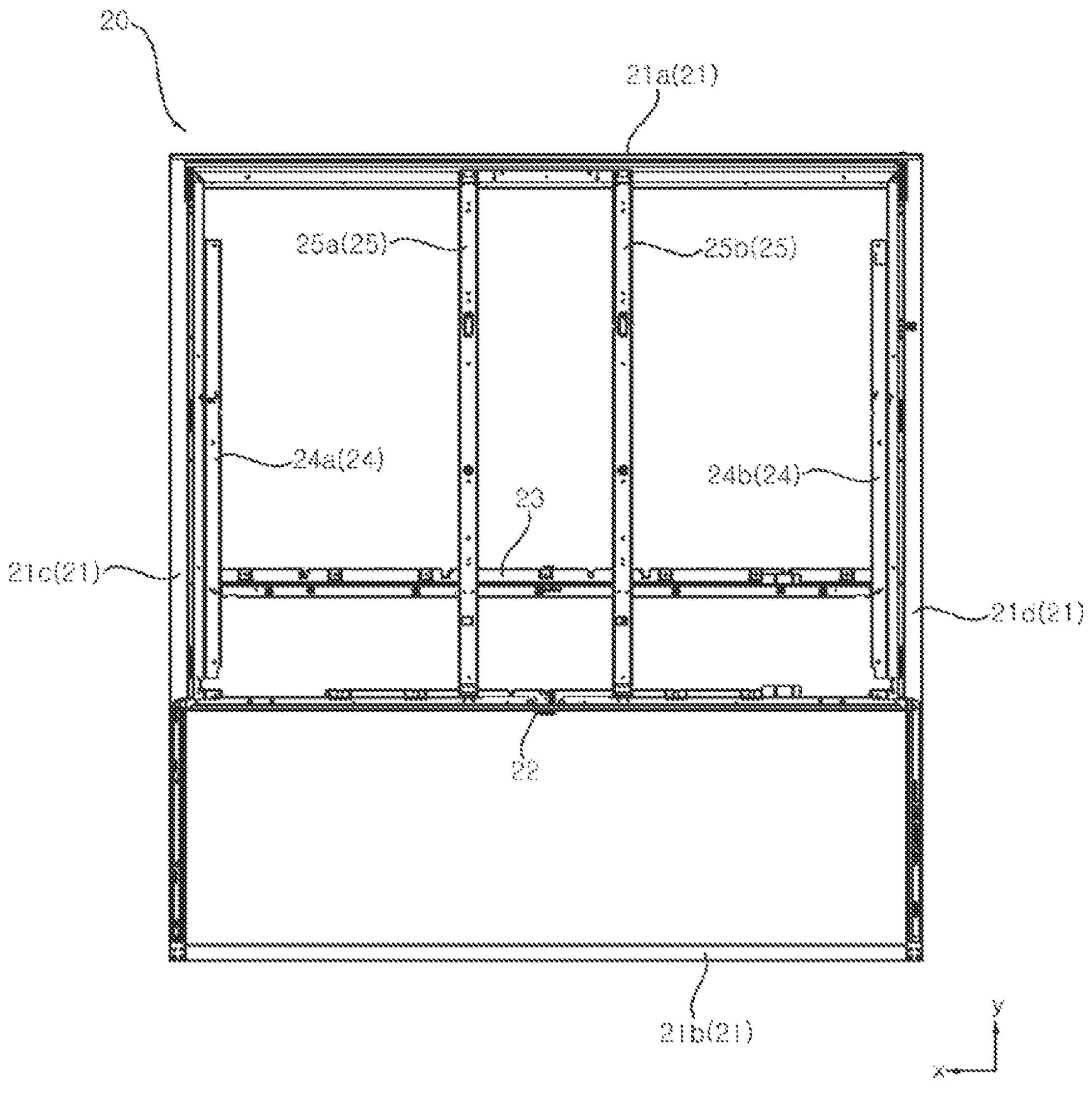

[FIG. 4]
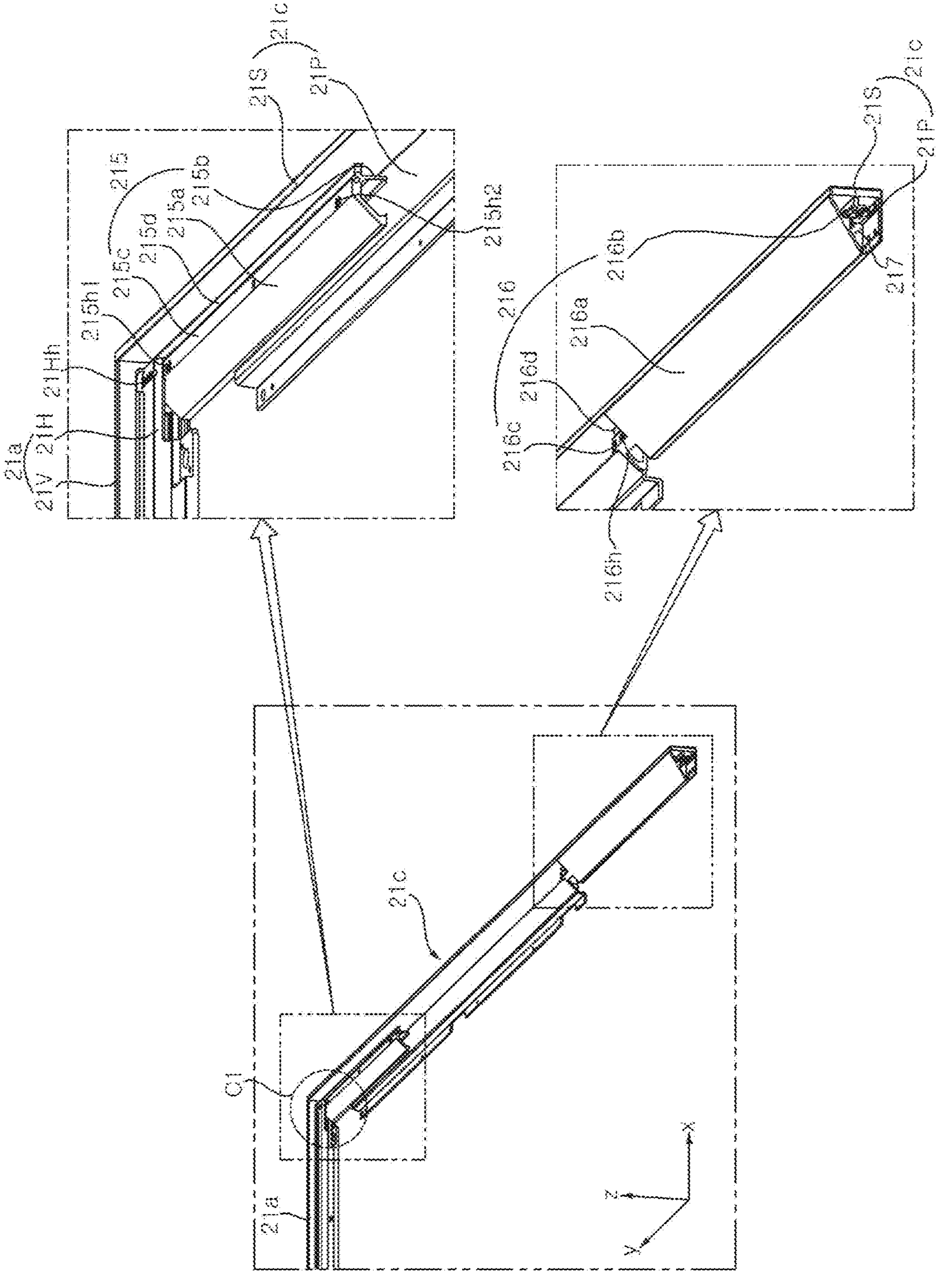

[FIG. 5]
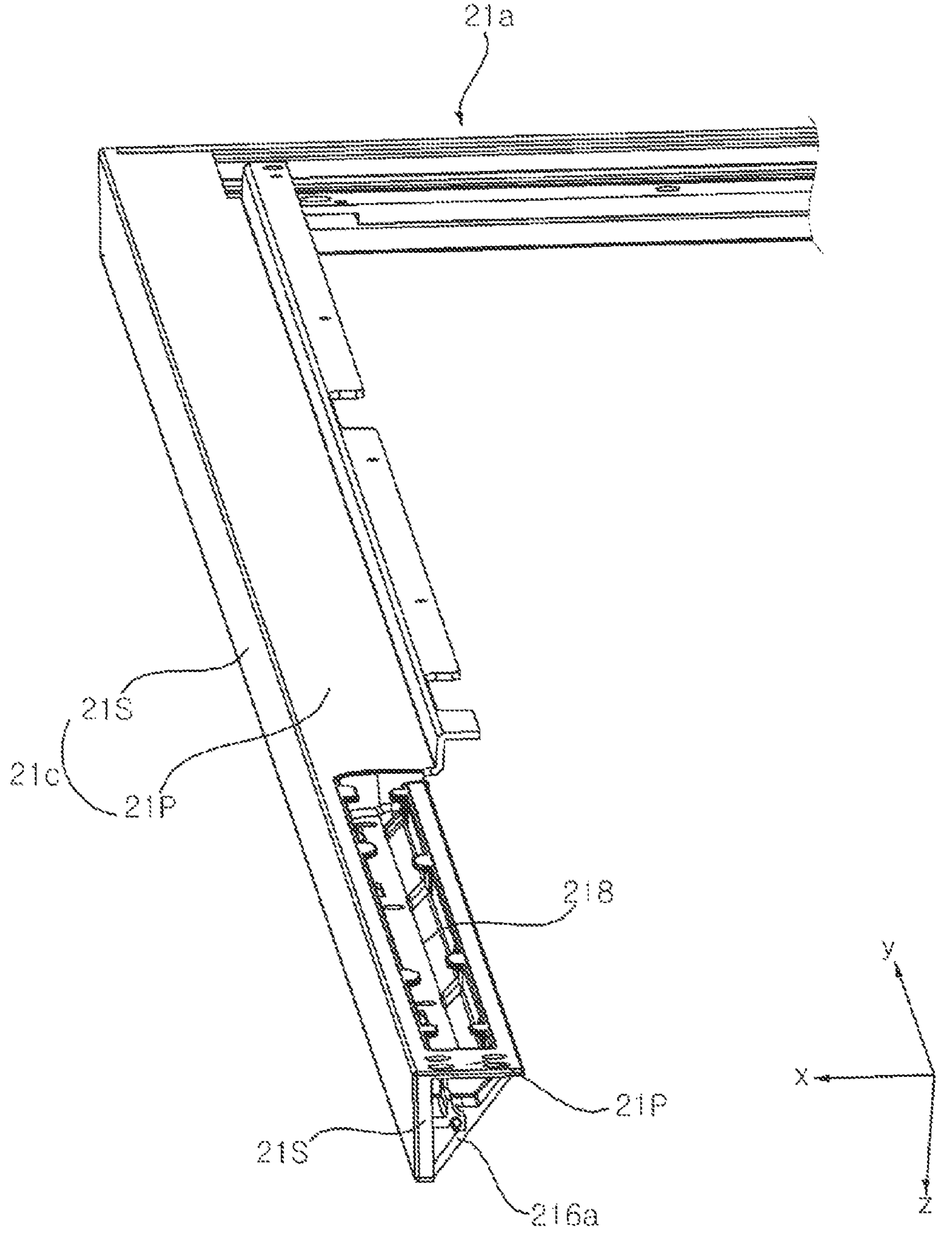

[FIG. 6]
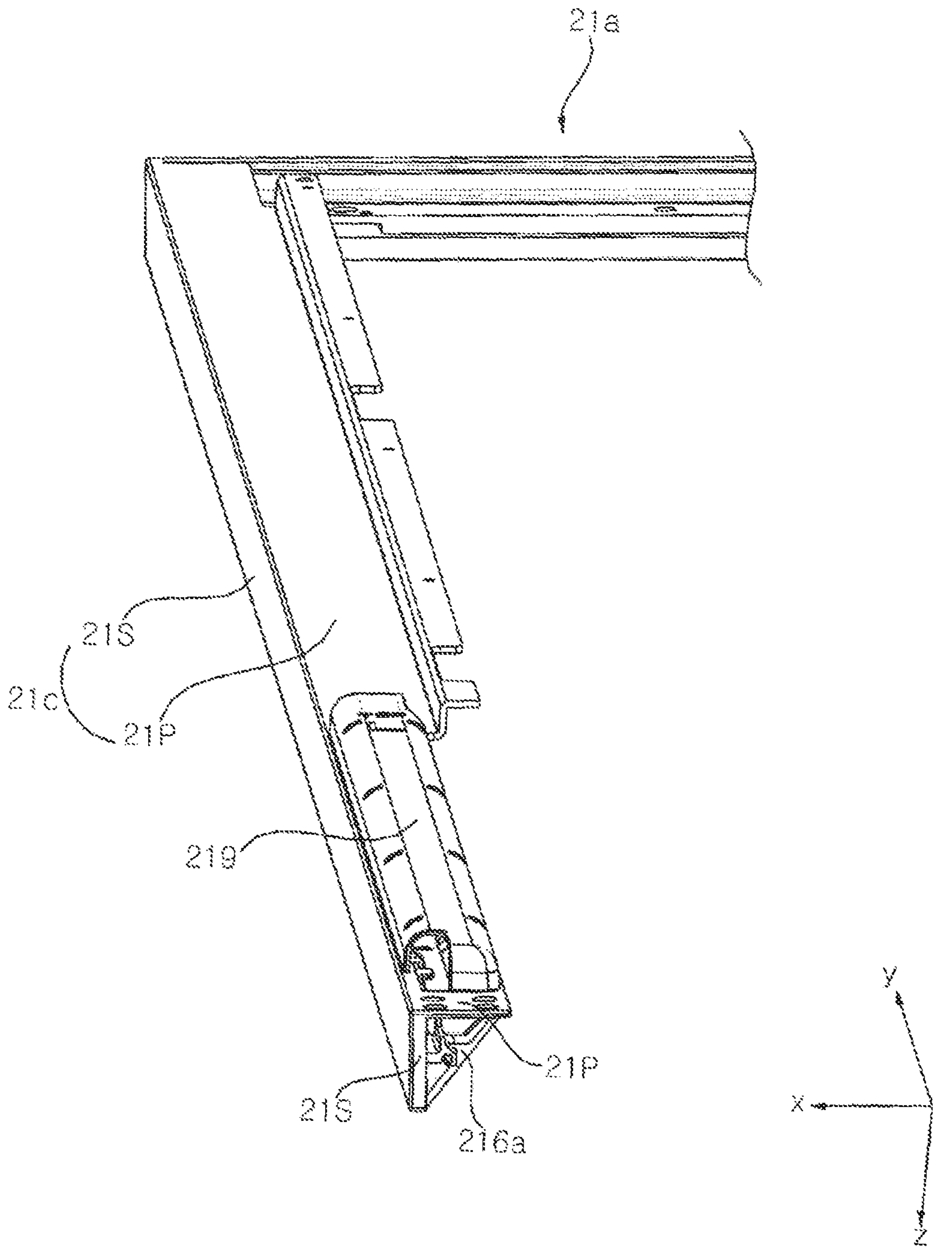

[FIG. 7]
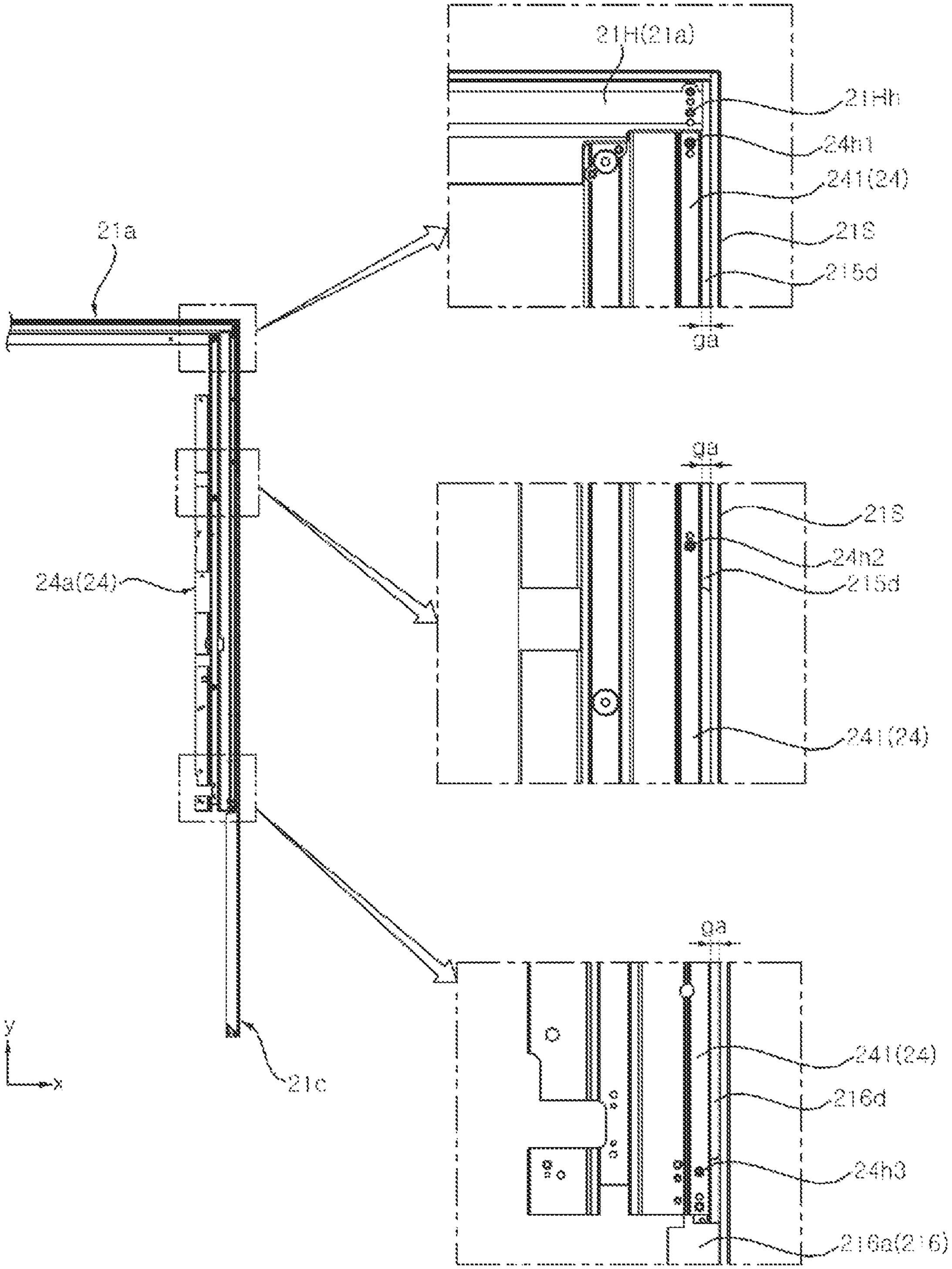

[FIG. 8]
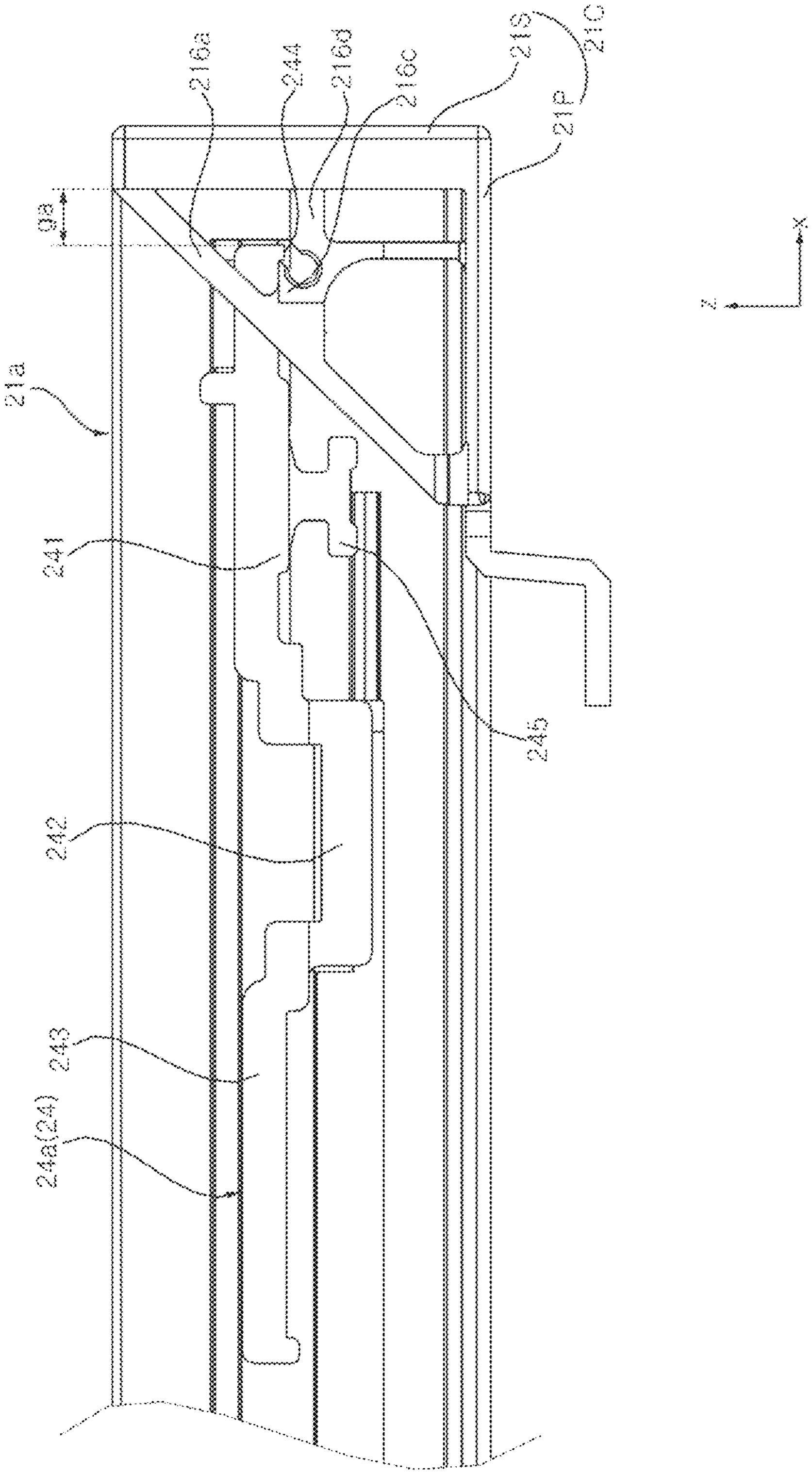

[FIG. 9]
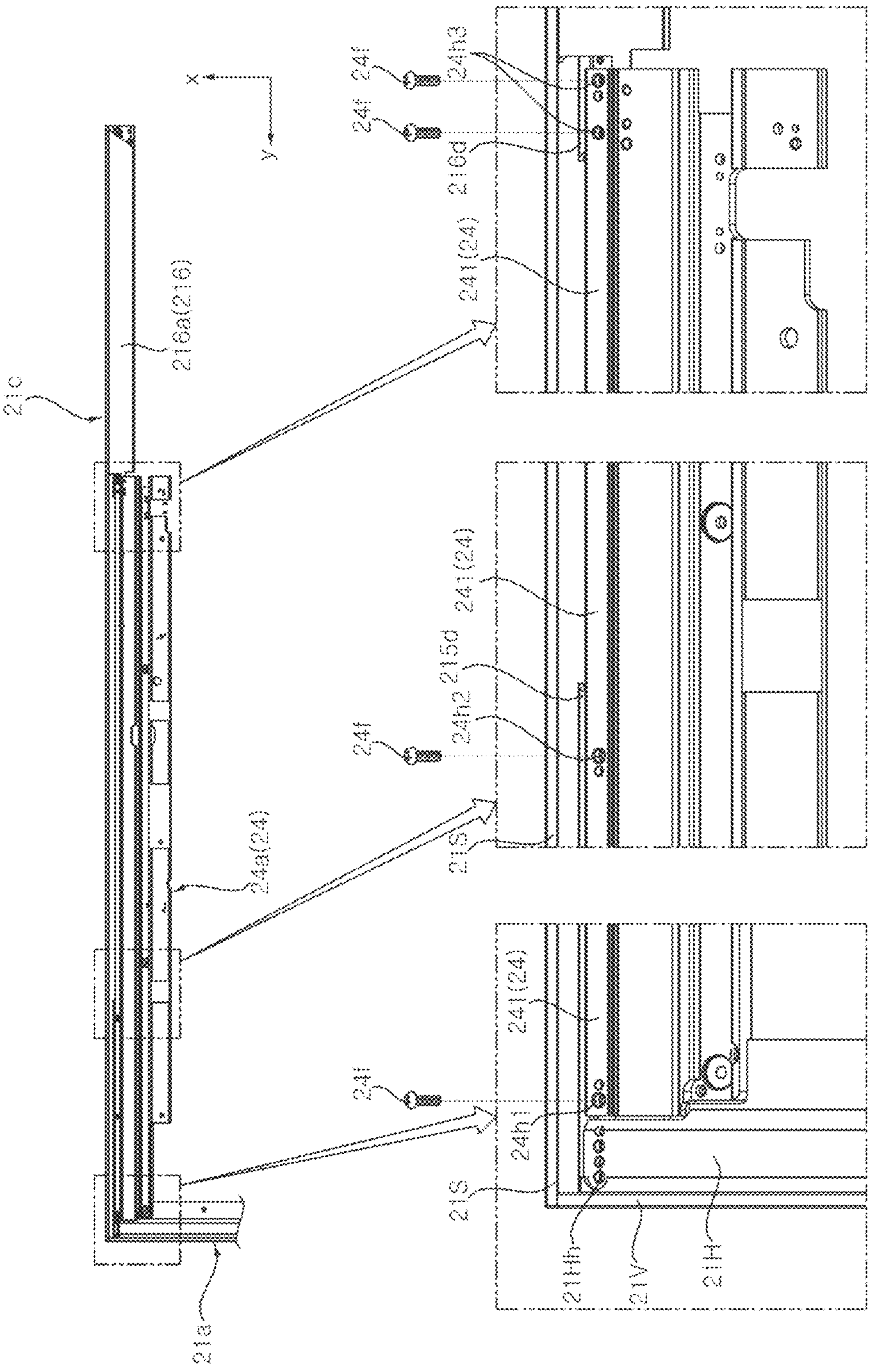

[FIG. 10]
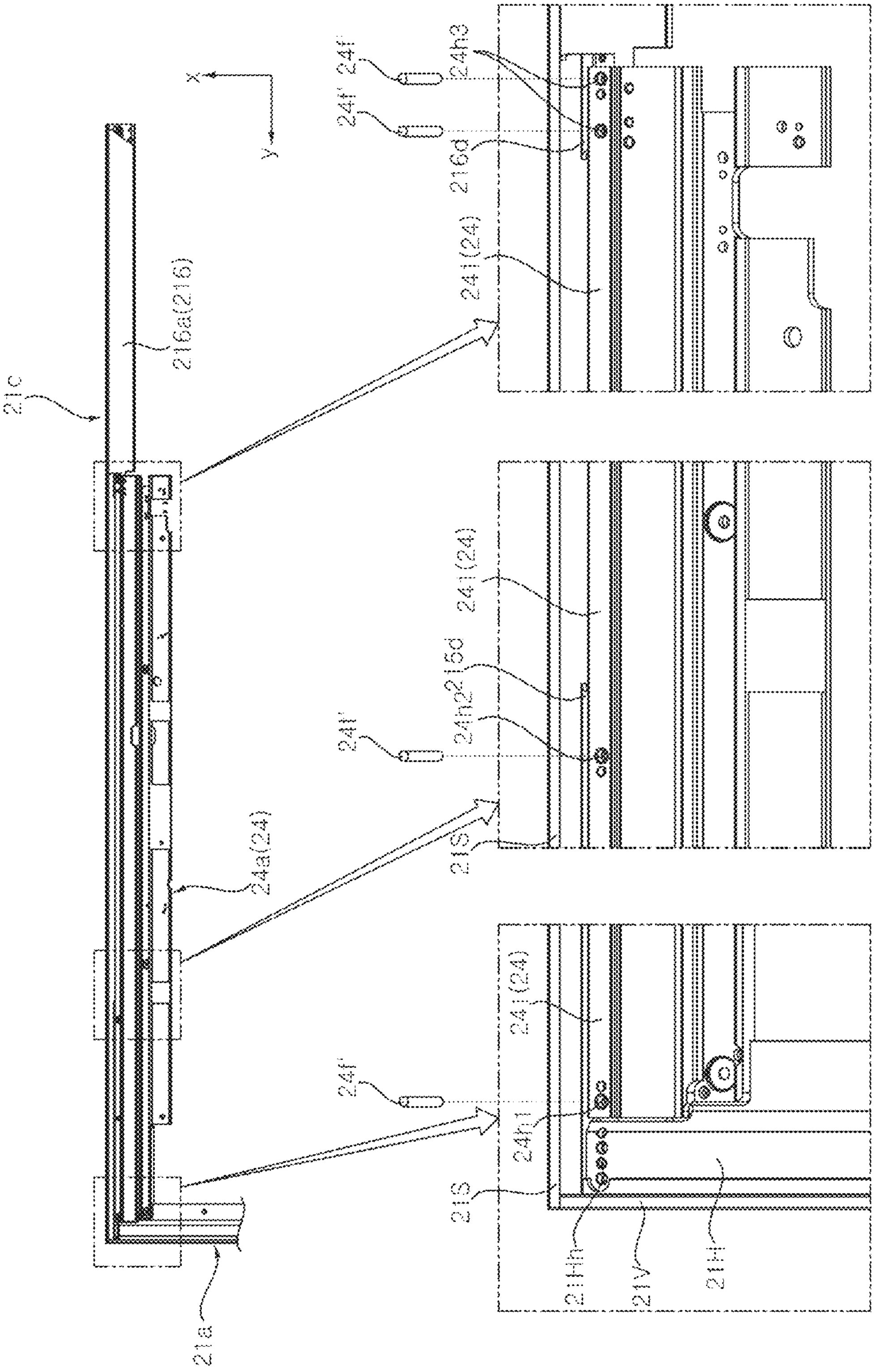

[FIG. 11]
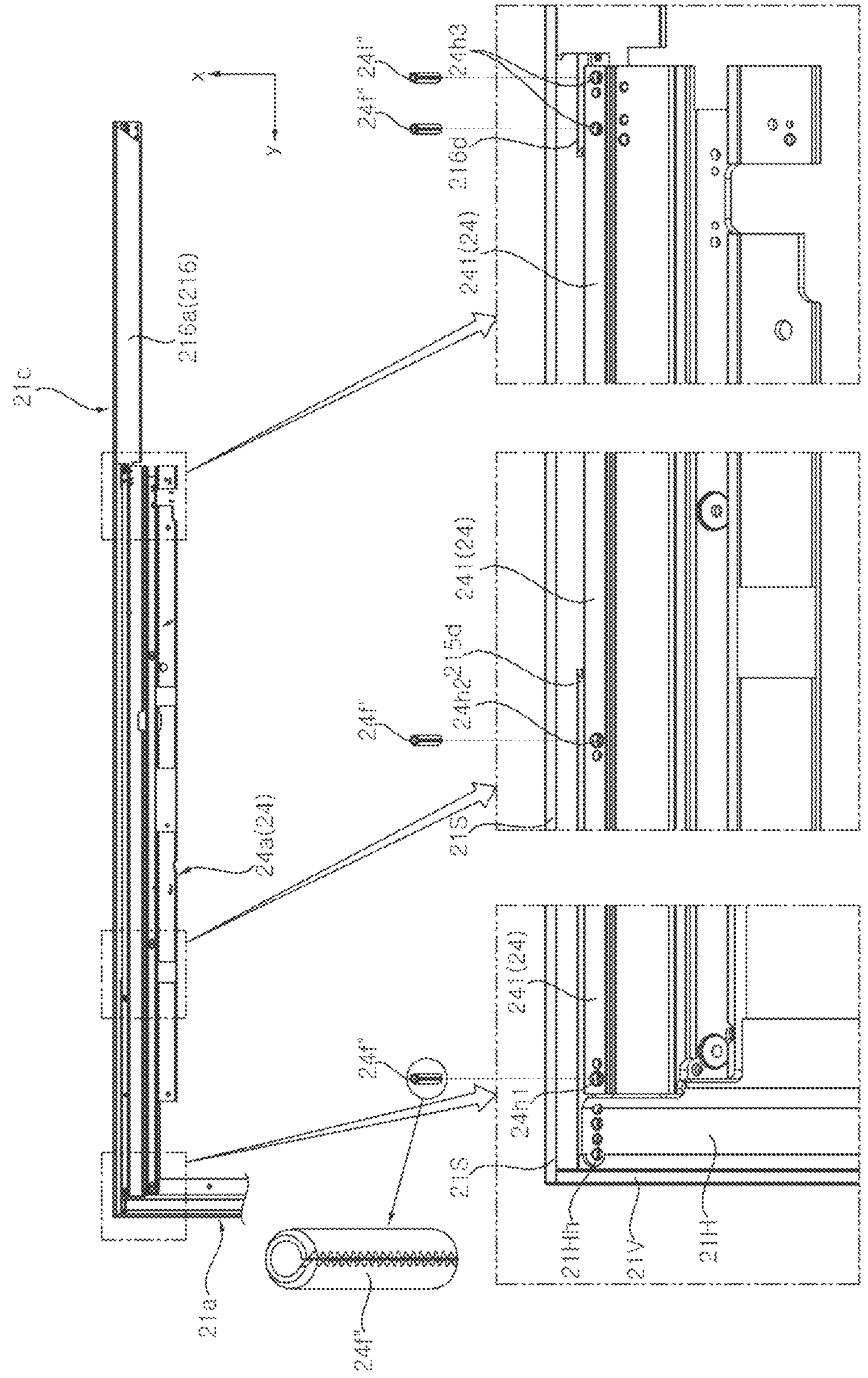

[FIG. 12]
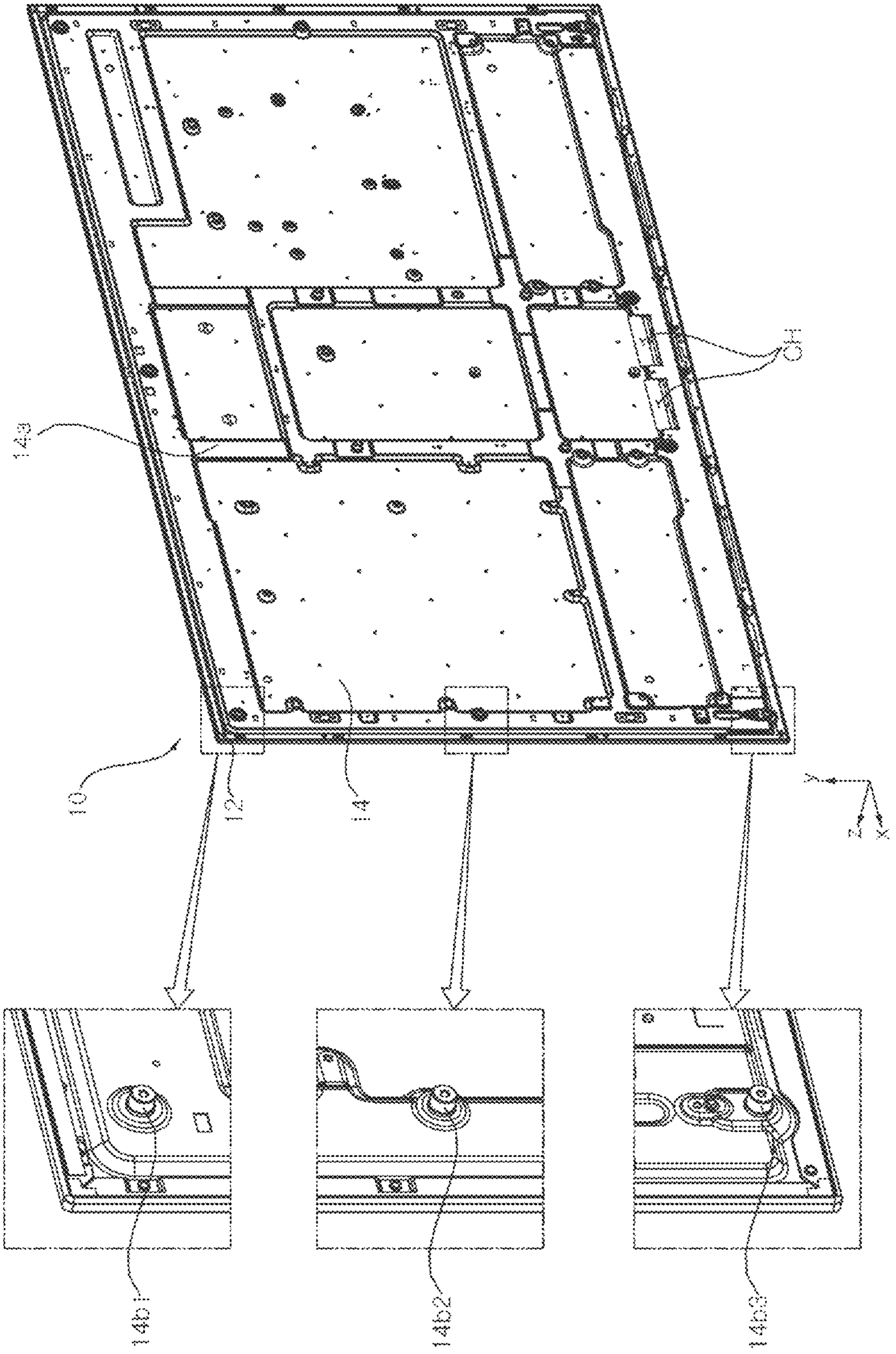

[FIG. 13]
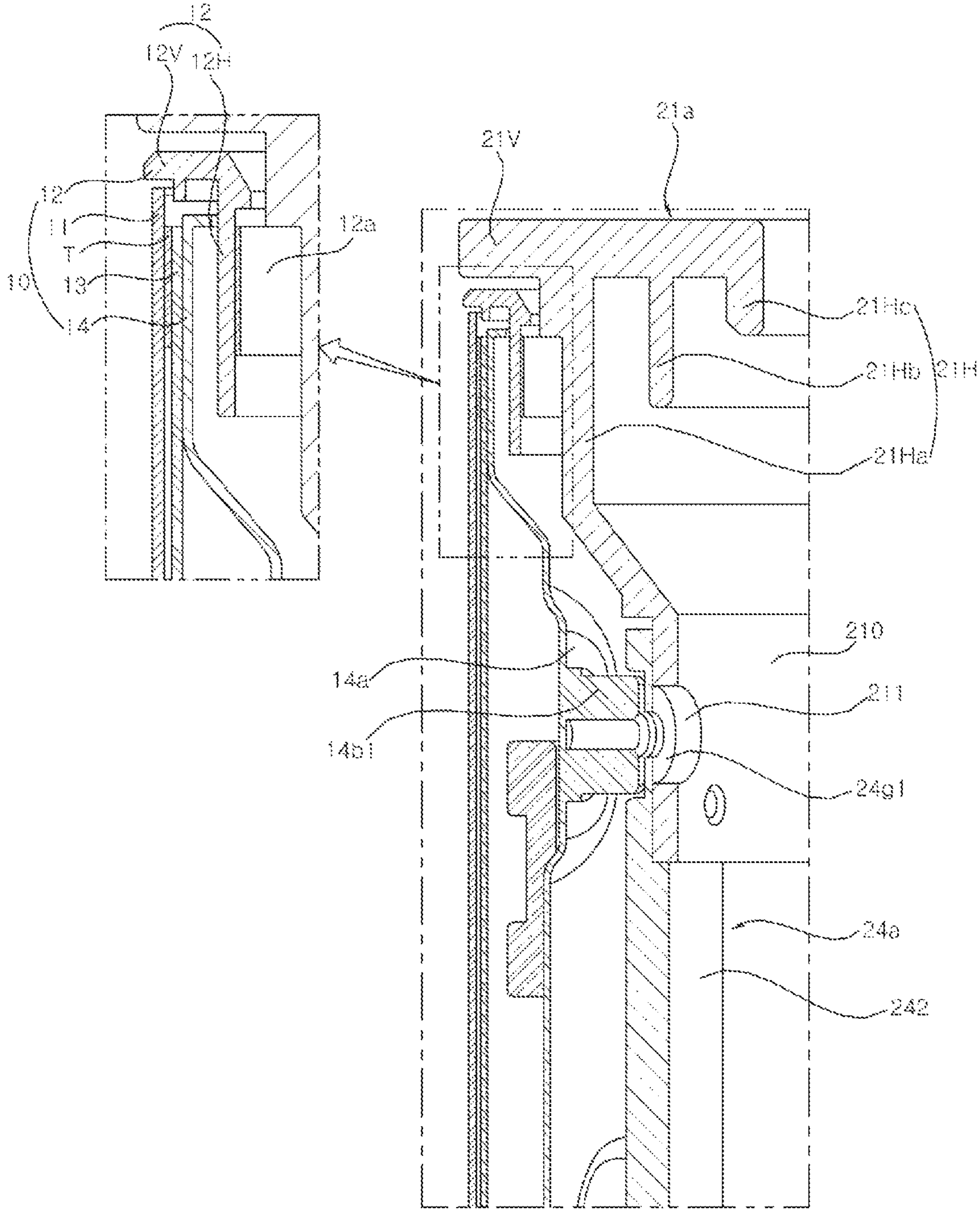

[FIG. 14]
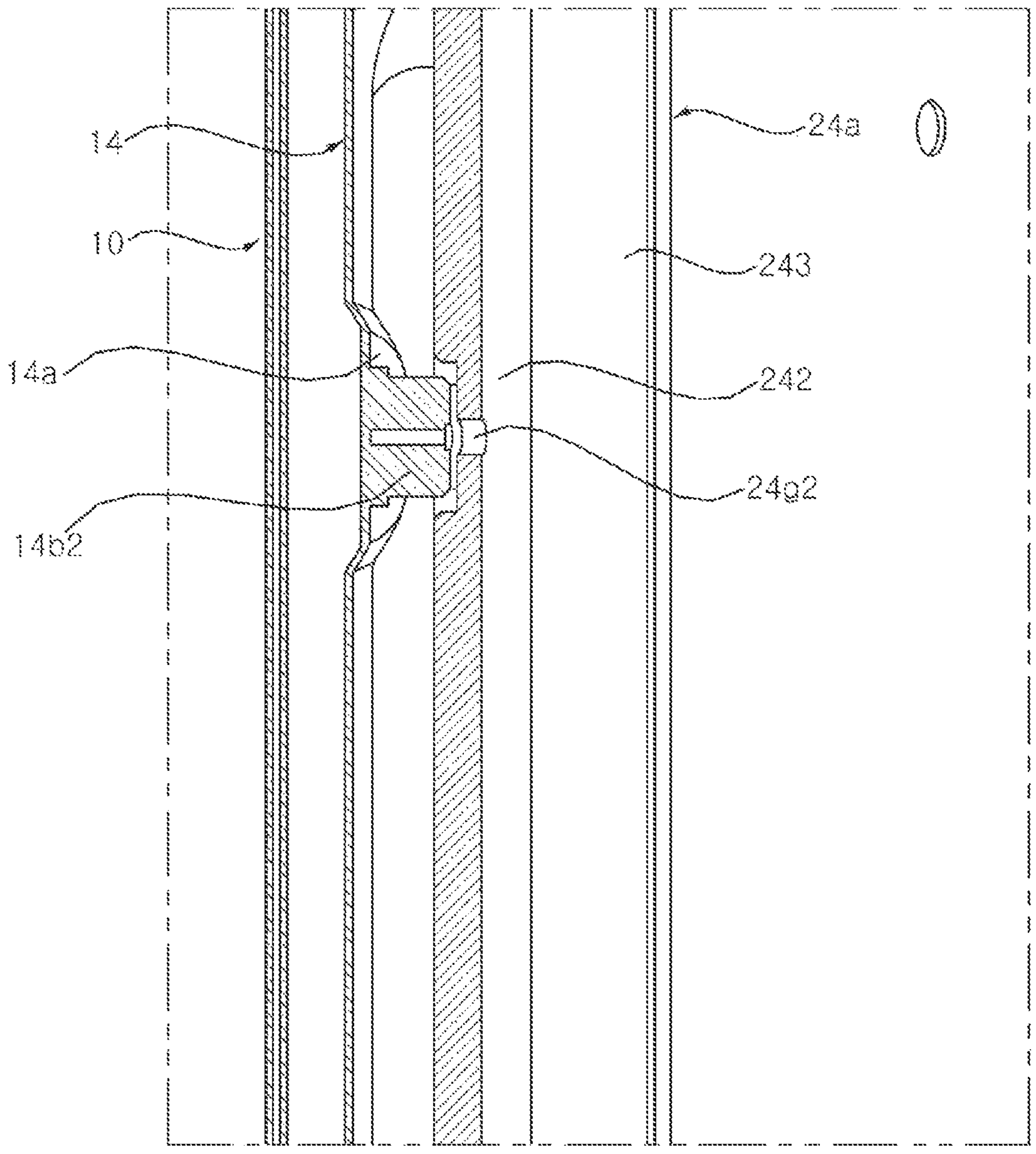

[FIG. 15]
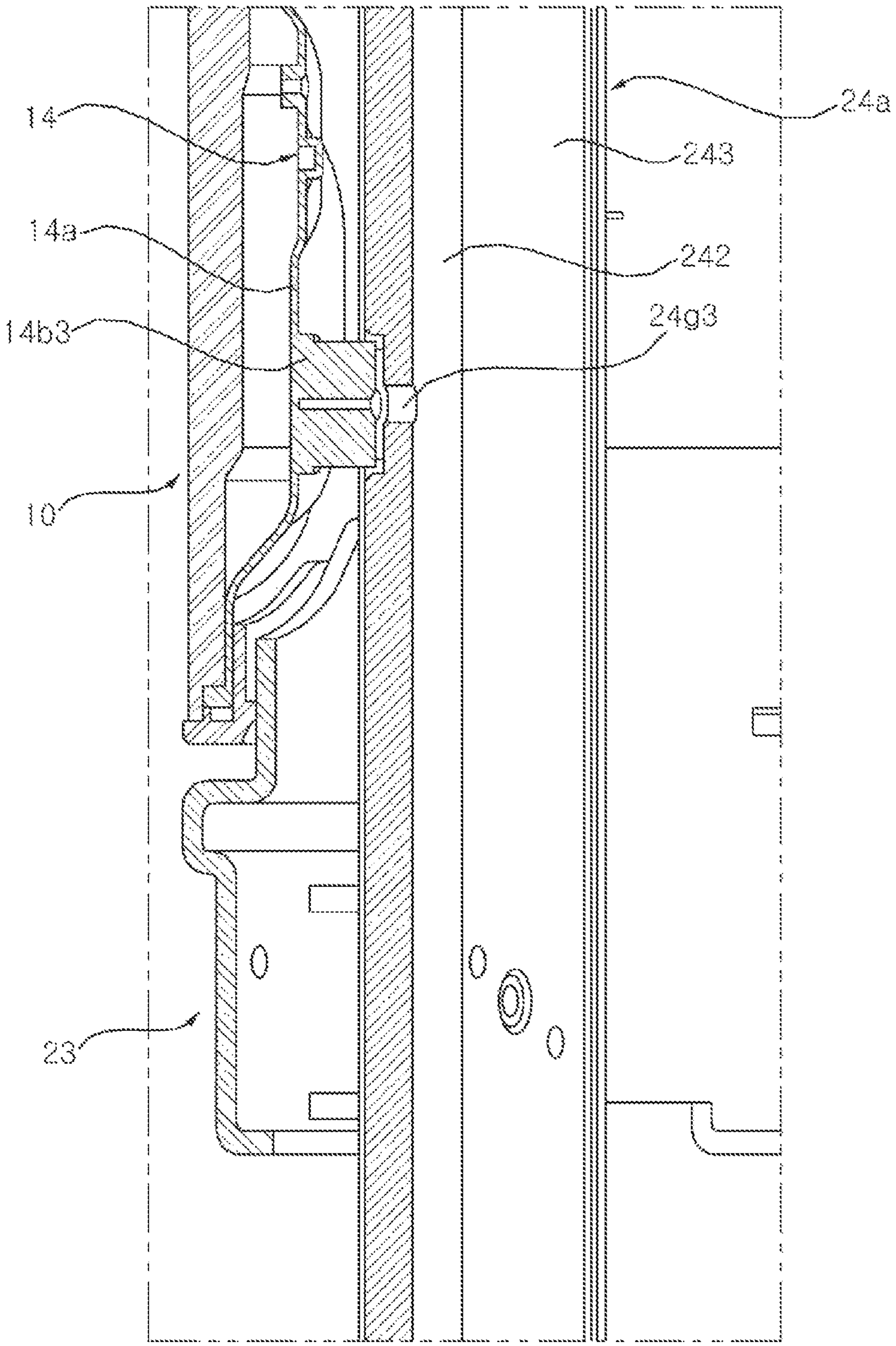

[FIG. 16]
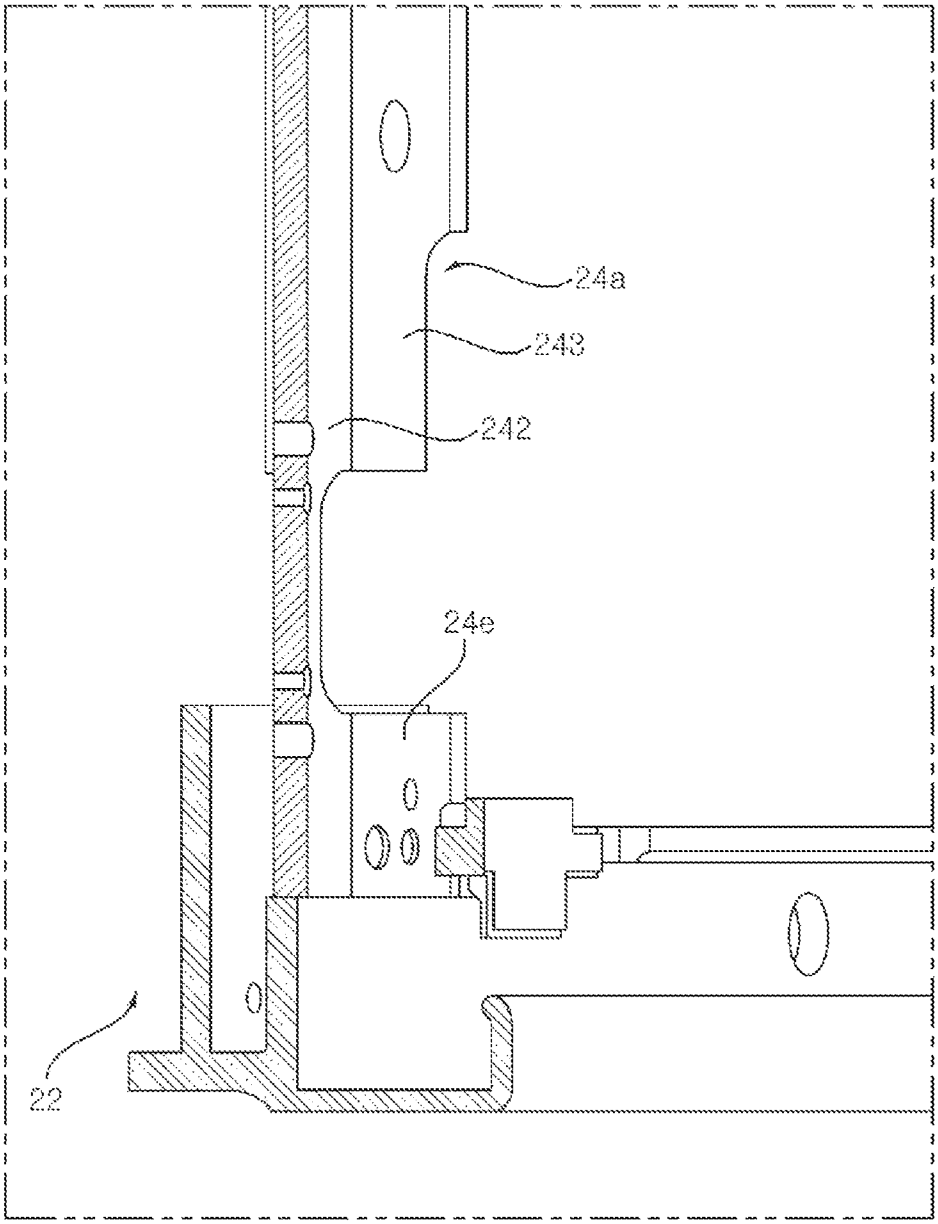

[FIG. 17]
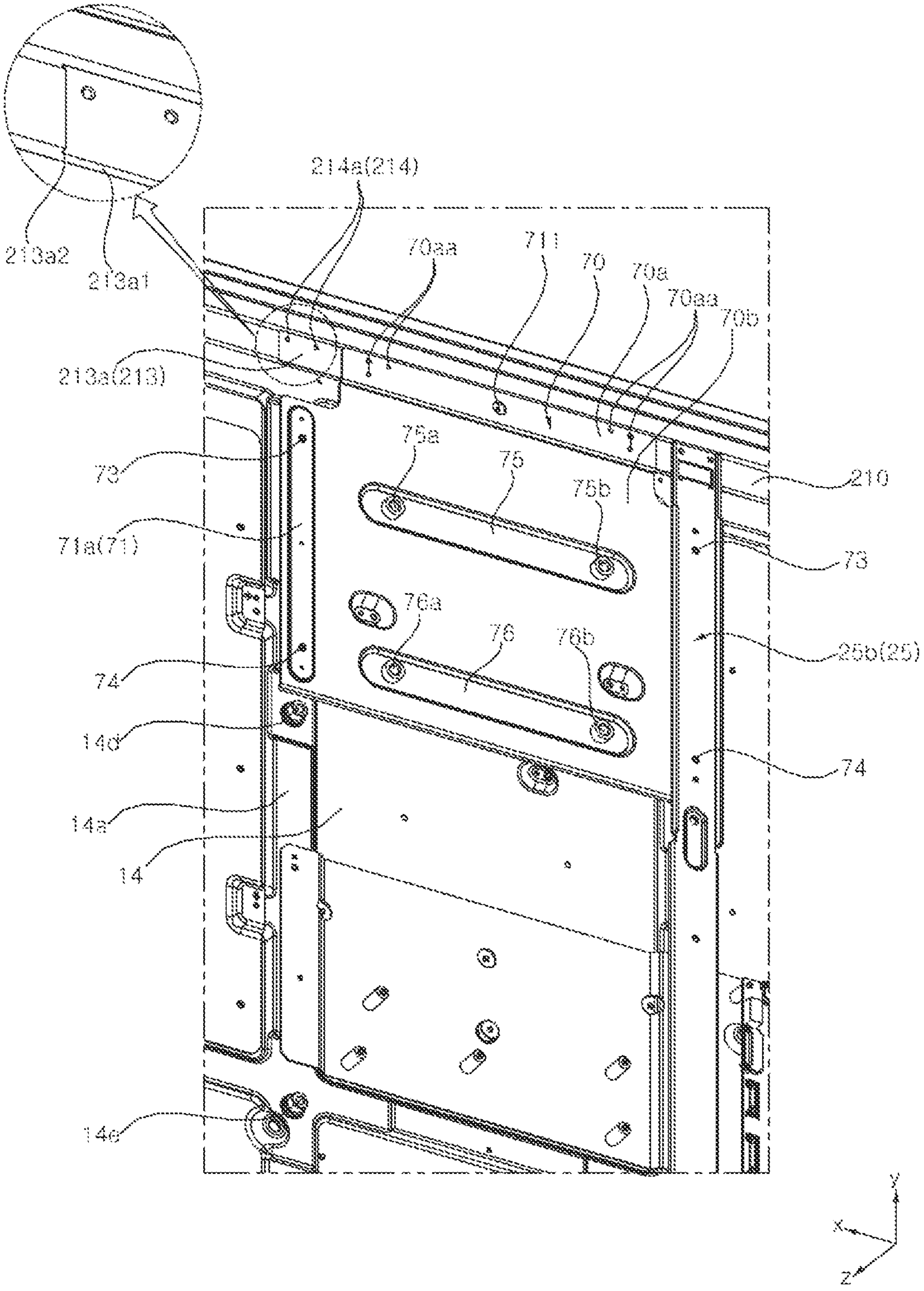

[FIG. 18]
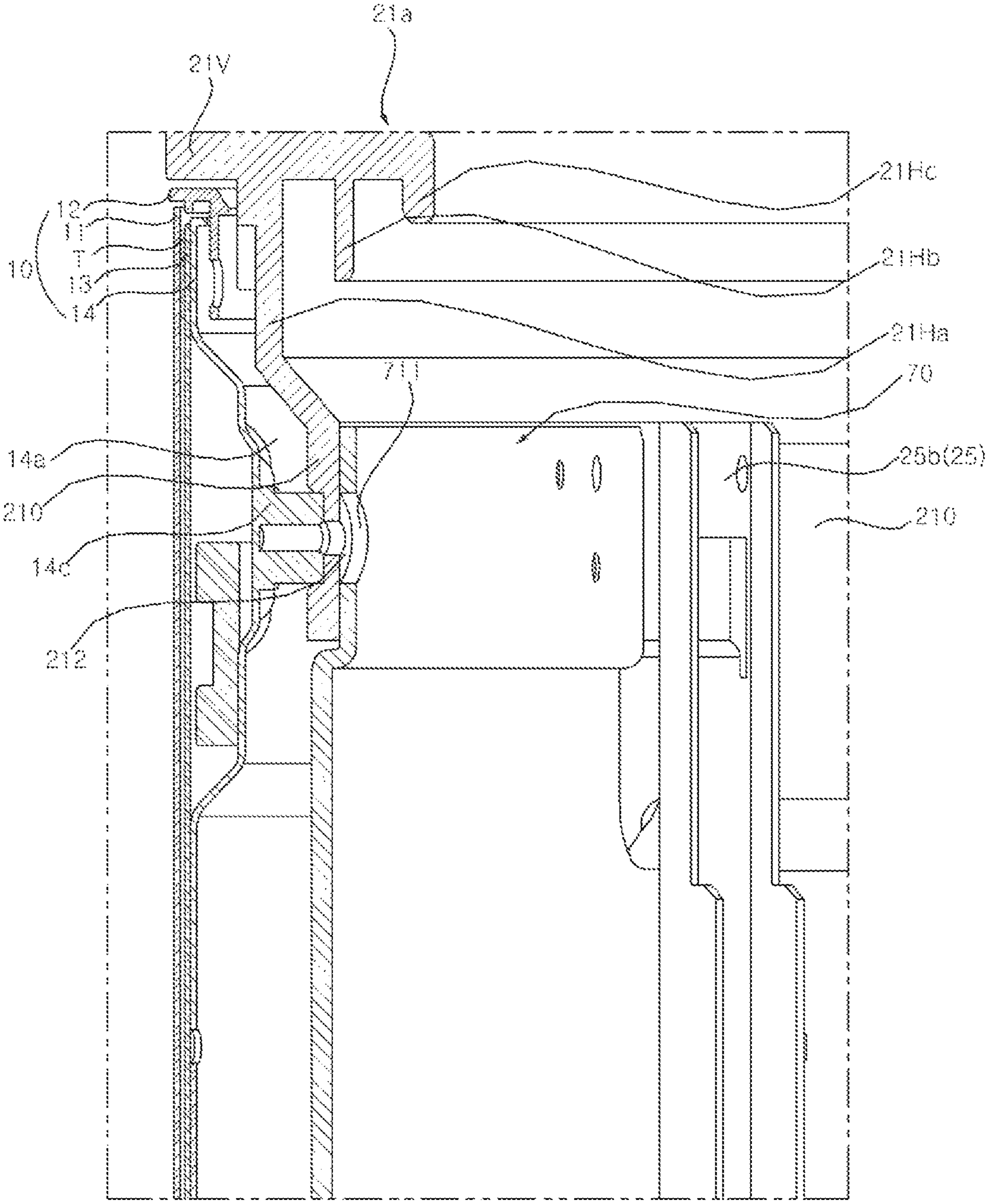

[FIG. 19]
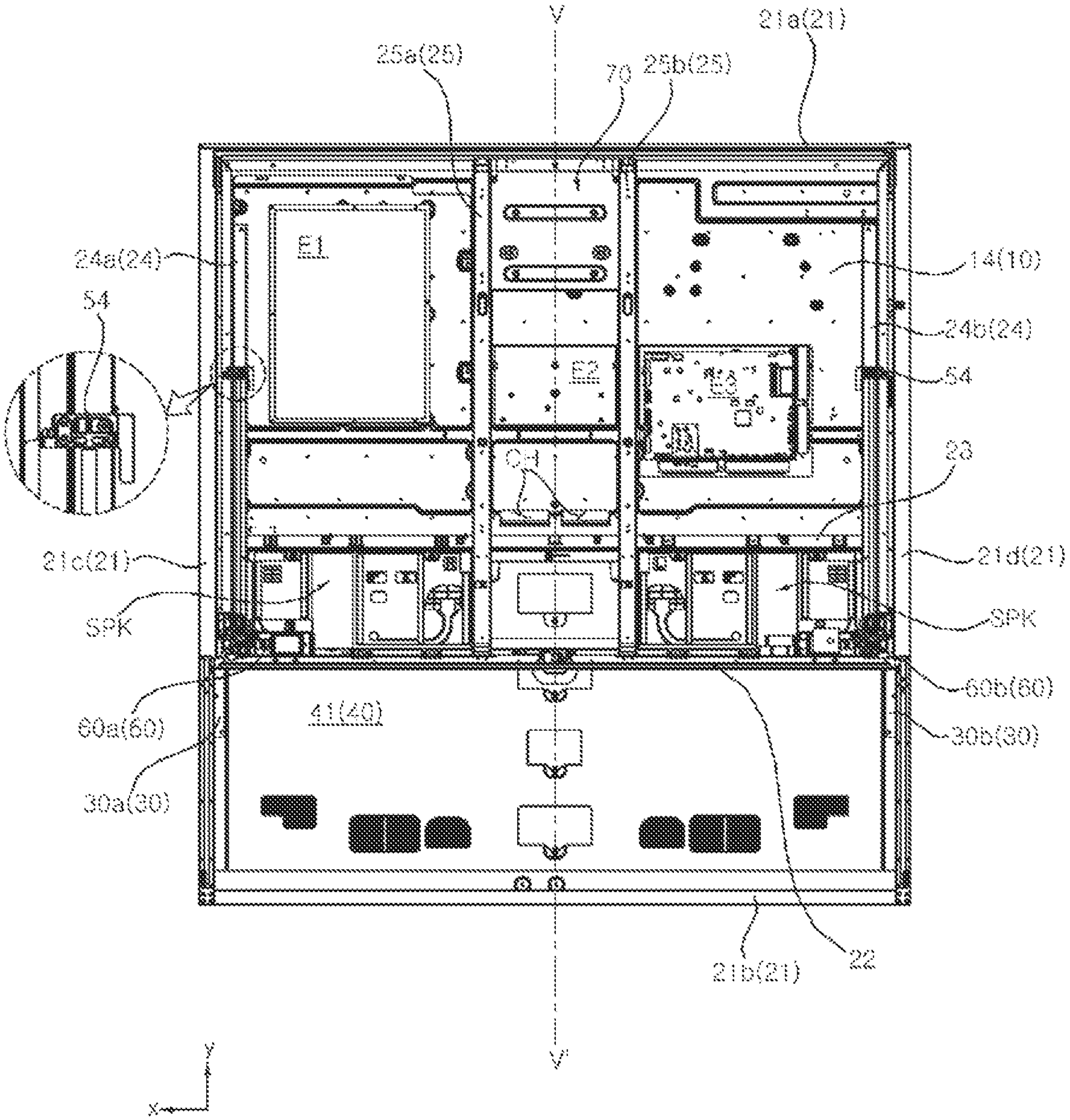

[FIG. 20]
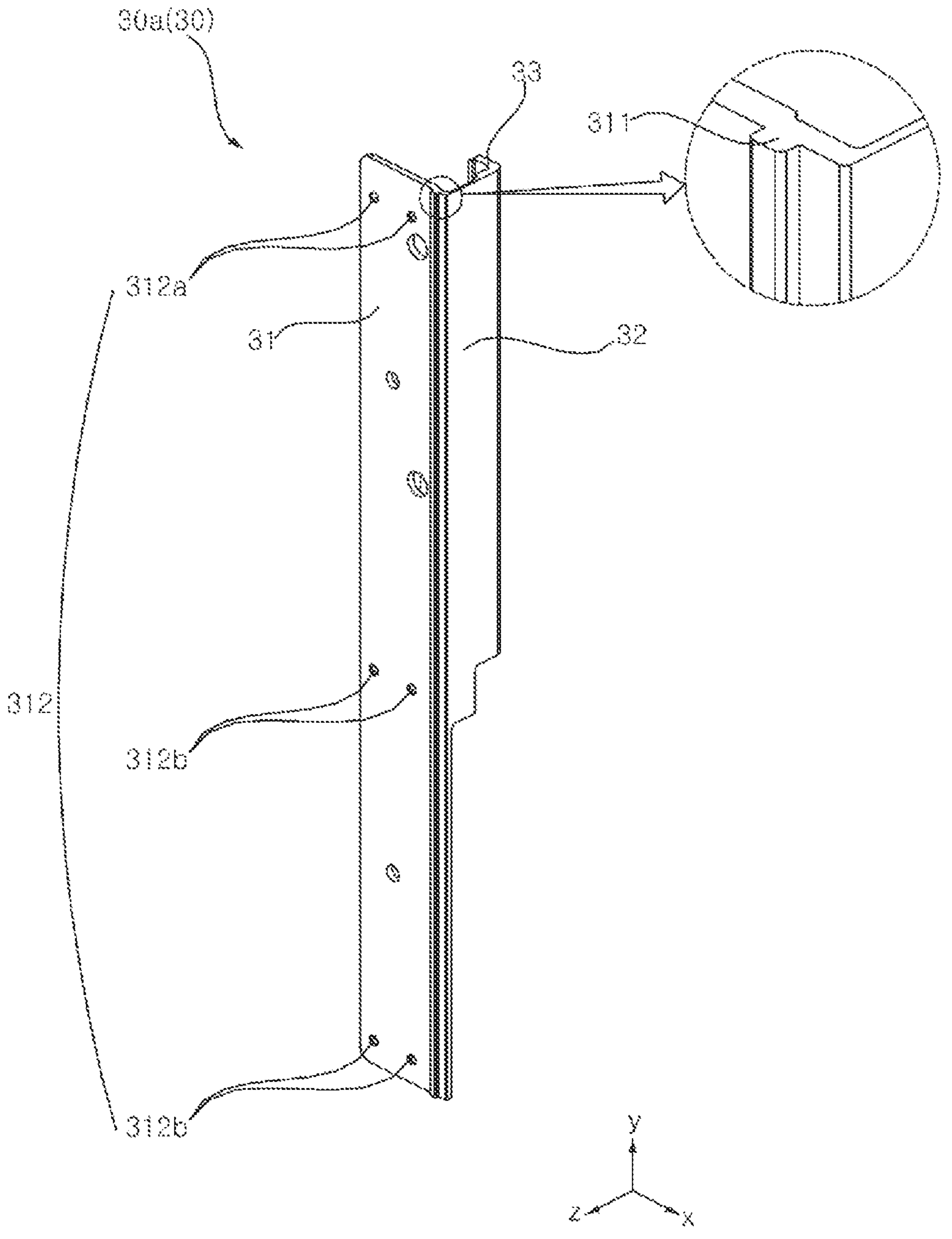

[FIG. 21]
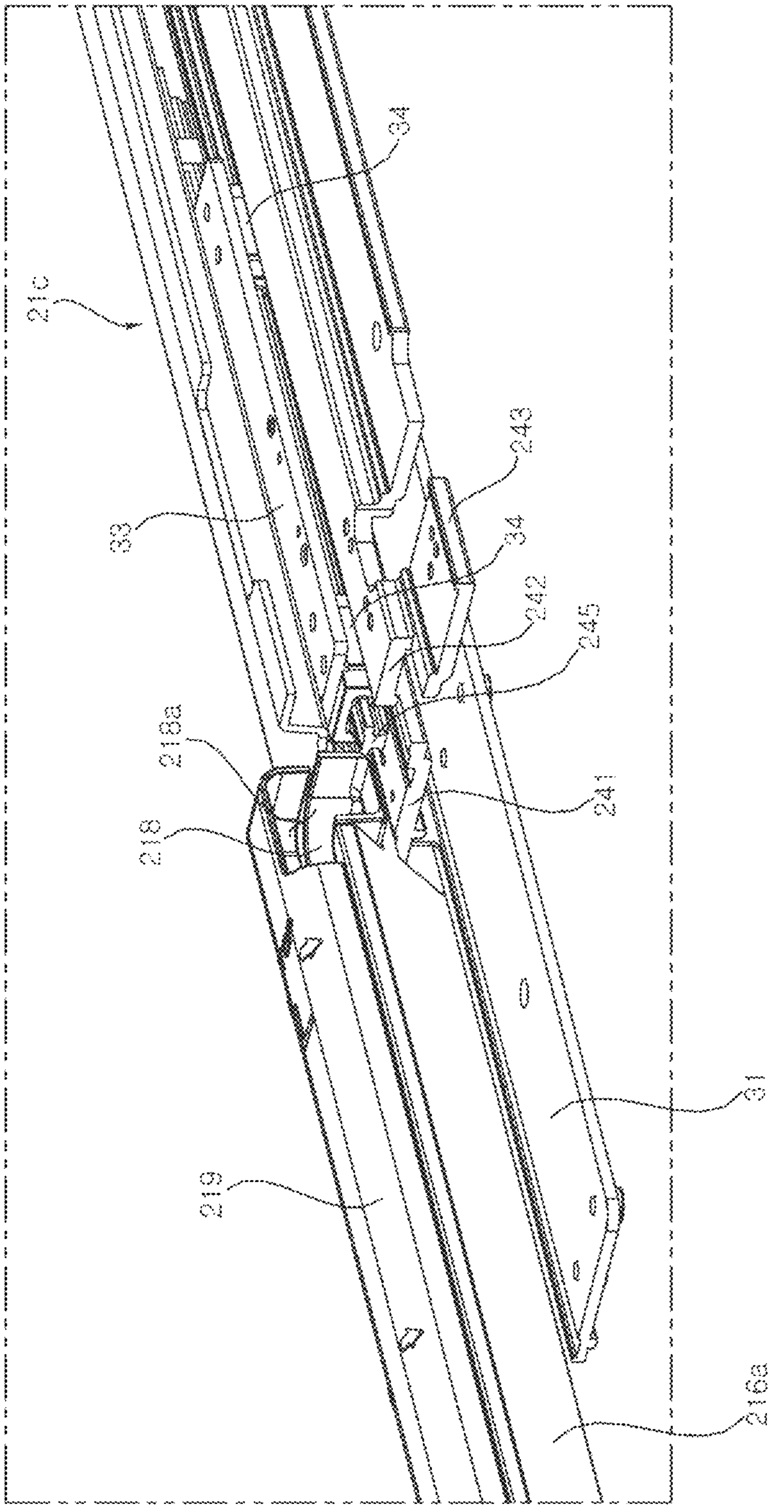

[FIG. 22]
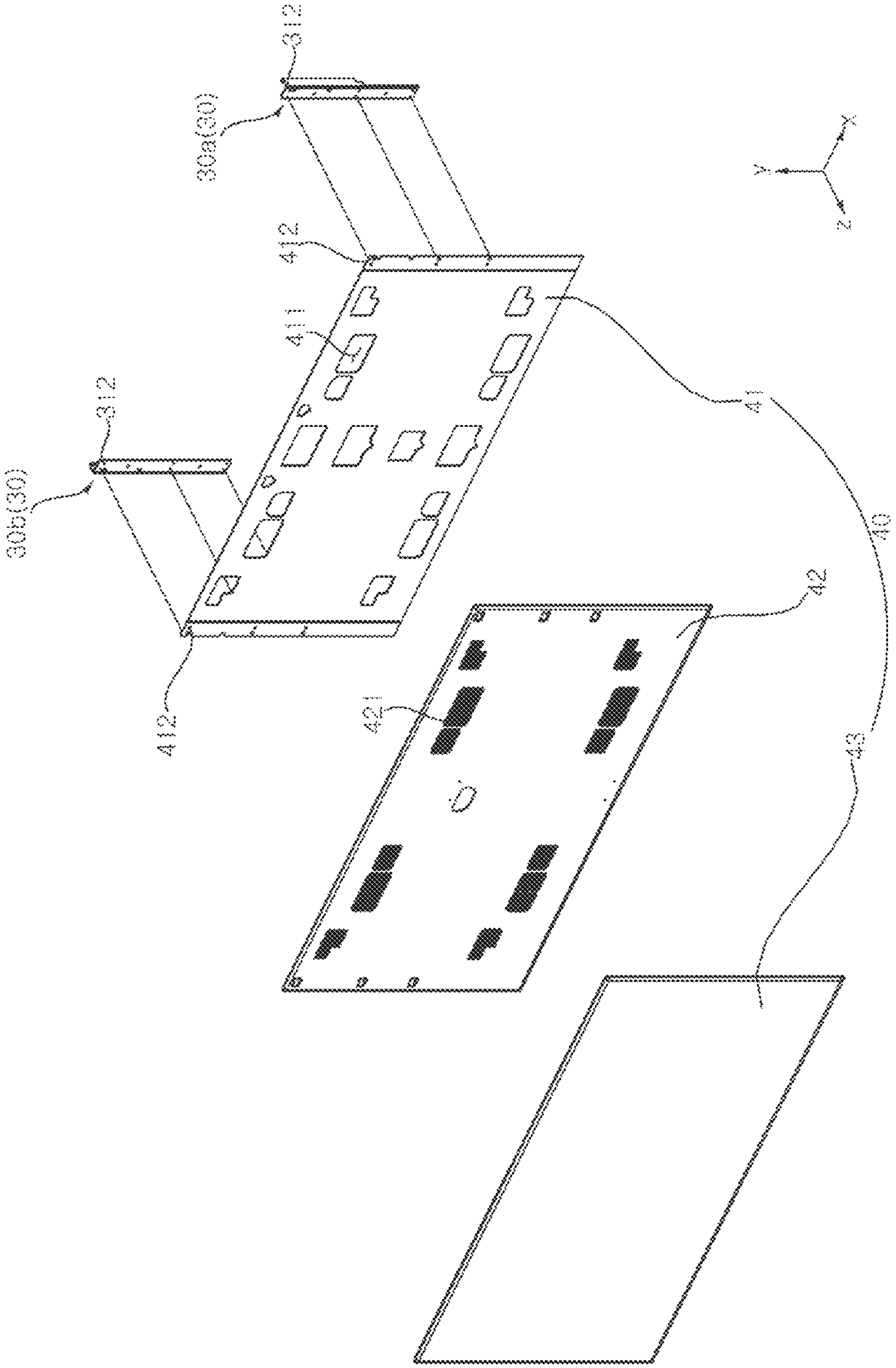

[FIG. 23]
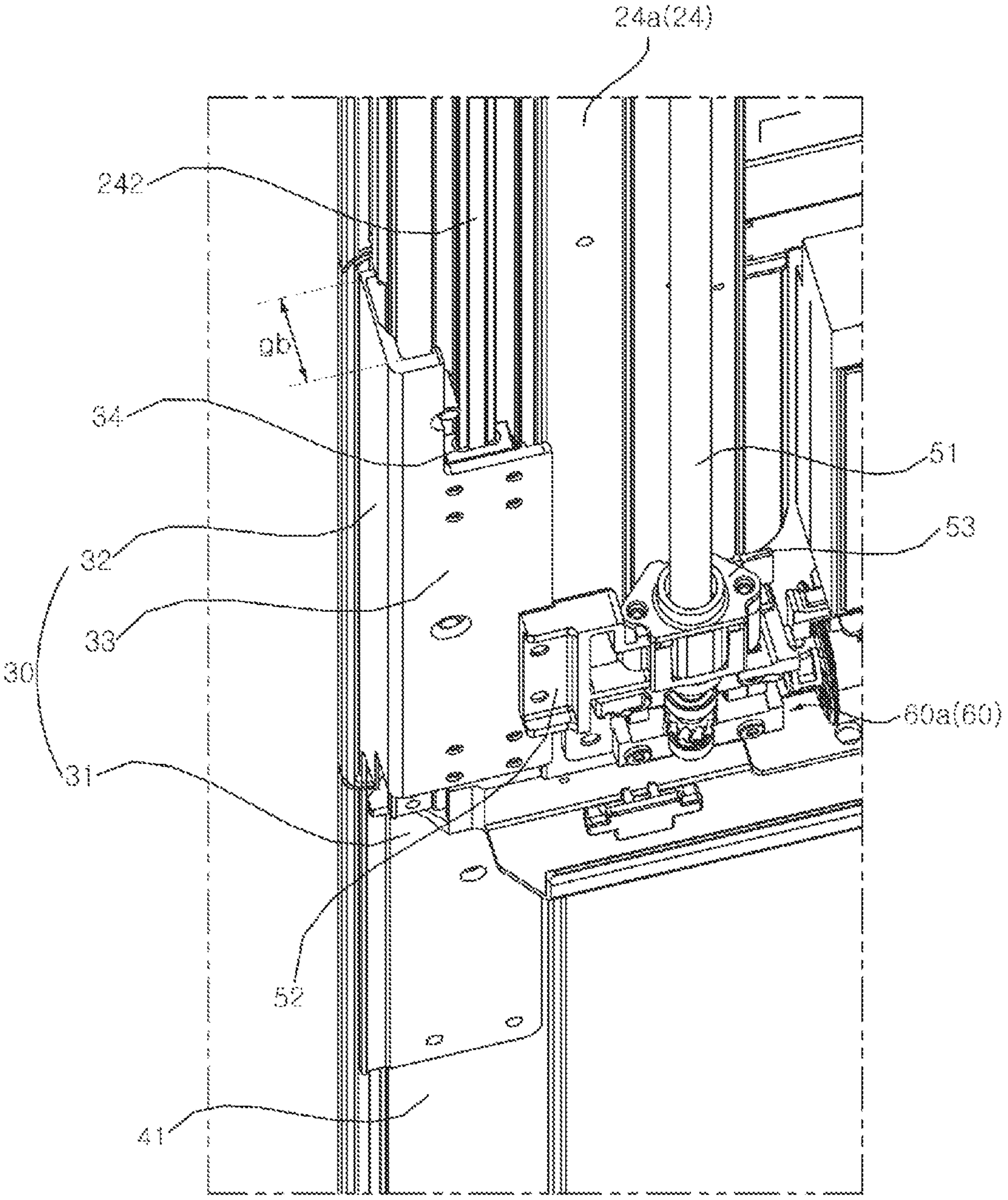

[FIG. 24]
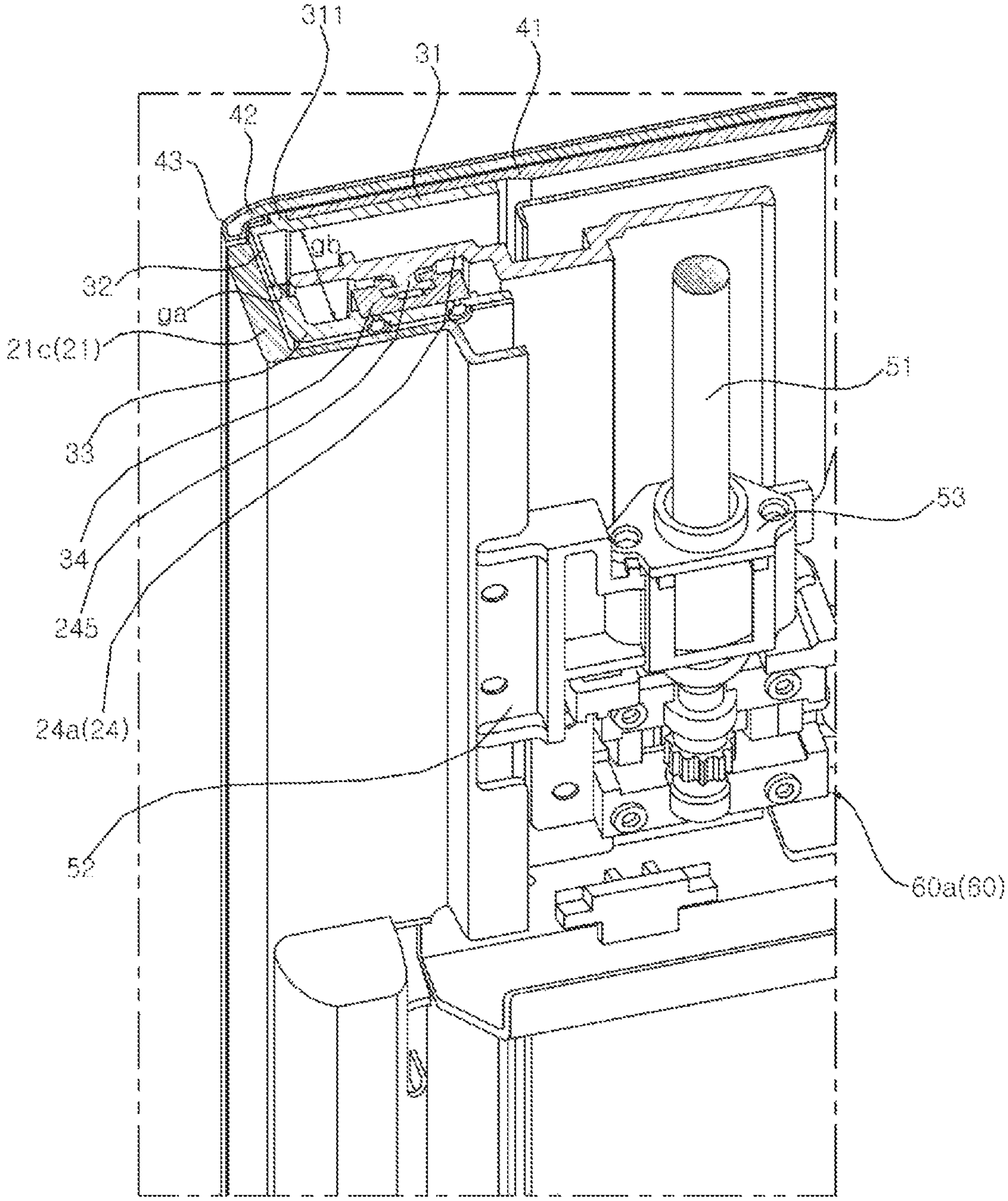

[FIG. 25]
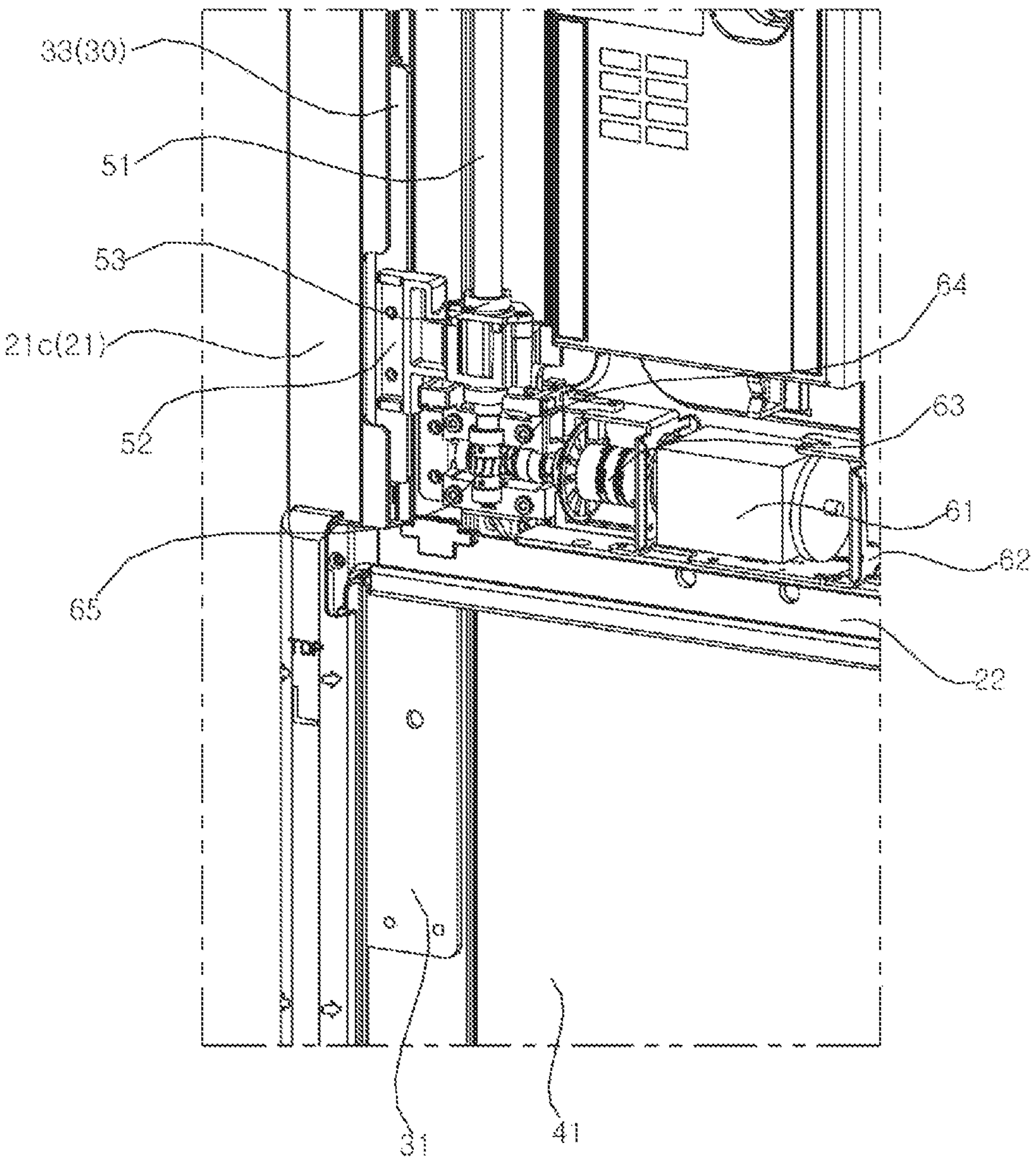

[FIG. 26]
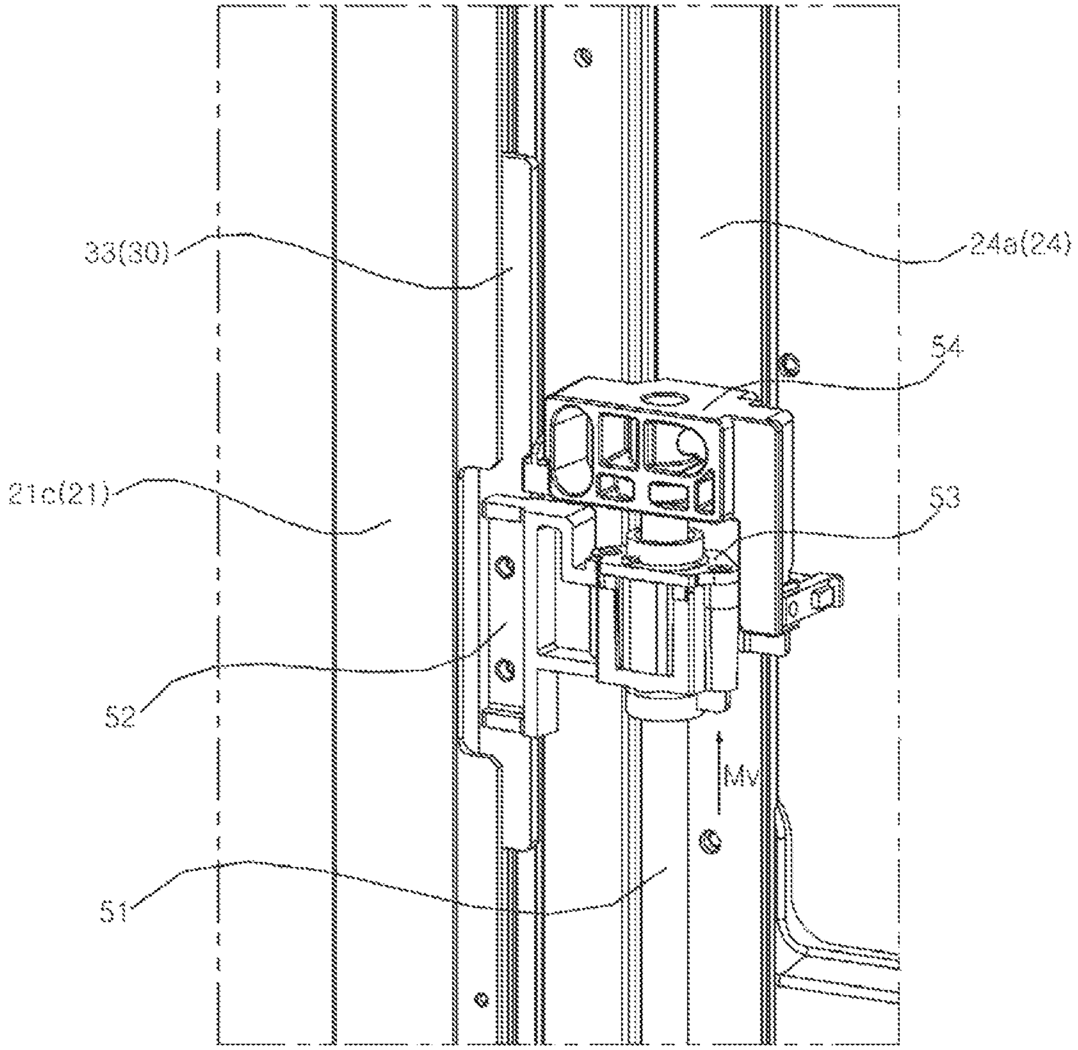

[FIG. 27]
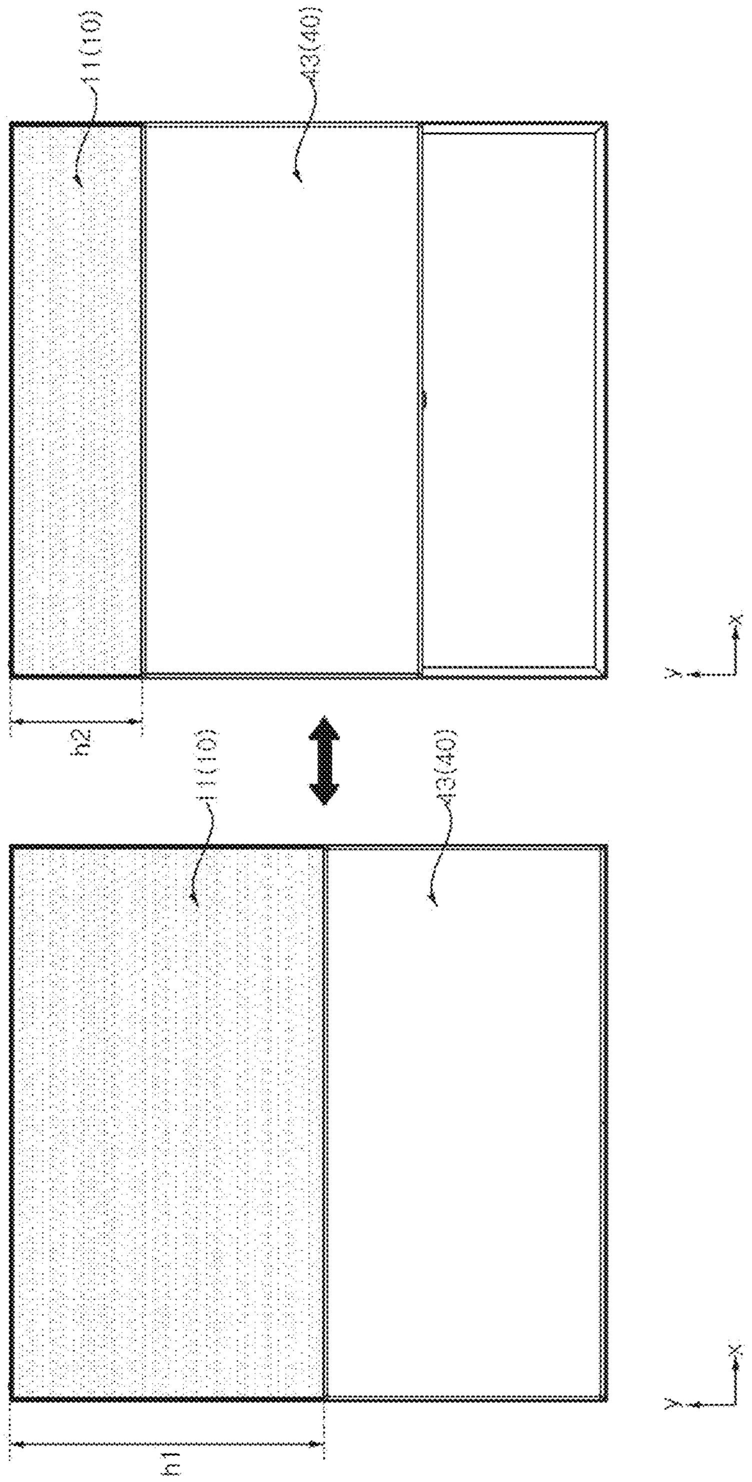

DISPLAY DEVICE

CROSS REFERENCE TO RELATED APPLICATIONS

This application is the National Phase of PCT International Application No. PCT/KR2021/006801, filed on Jun. 1, 2021, all of which is hereby expressly incorporated by reference into the present application.

TECHNICAL FIELD

The present disclosure relates to a display device.

BACKGROUND ART

With the development of the information society, there have been growing demands for various types of display devices, and in order to meet these demands, various display devices, such as a liquid crystal display (LCD) device, a plasma display panel (PDP), an electroluminescent display (ELD), a vacuum fluorescent display (VFD), an organic light emitting diode (OLED), etc., have been studied and used recently.

Among them, the LCD panel includes a TFT substrate and a color substrate which are positioned opposite each other with a liquid crystal layer interposed therebetween, and displays an image by using light provided by a backlight unit. Further, the OLED panel may display an image by using a self-emitting organic layer deposited on a substrate on which transparent electrodes are formed.

Recently, a structure for covering a front surface of a display panel is being actively researched.

DISCLOSURE OF INVENTION

Technical Problem

It is an objective of the present disclosure to solve the above and other problems.

Another objective may be to provide a coupling structure of a frame forming the skeleton of a display device, and to improve the rigidity of the frame.

Another objective may be to provide a cover assembly capable of opening and closing a front surface of a display panel, and movement and coupling structure of the cover assembly relative to a frame.

Another objective may be to provide a coupling structure between a module cover, to which a display panel is coupled, and a frame.

Solution to Problem

In accordance with an aspect of the present disclosure, the above and other objects can be accomplished by providing a display device including: a module cover; a display panel coupled to the module cover at a front of the module cover; an outer frame surrounding a side surface of the module cover; a guide frame elongated and disposed behind the module cover adjacent to the outer frame; and a cover assembly disposed in front of the display panel, and coupled to the guide frame to be movable in a longitudinal direction of the guide frame, wherein the guide fame is coupled to the outer frame and the module cover.

Advantageous Effects of Invention

The display device according to the present disclosure has the following effects.

According to at least one of the embodiments of the present disclosure, a coupling structure of a frame forming the skeleton of a display device may be provided, and the rigidity of the frame may be improved.

According to at least one of the embodiments of the present disclosure, there may be provided a cover assembly capable of opening and closing a front surface of a display panel, and movement and coupling structure of the cover assembly relative to a frame.

According to at least one of the embodiments of the present disclosure, a coupling structure between a module cover, to which a display panel is coupled, and a frame may be provided.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 1 to 27 are diagrams illustrating examples of a display device according to embodiments of the present disclosure.

MODE FOR INVENTION

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the ease of the description, and do not have a distinguishing meaning or role.

In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms "first," "second," etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

In the following description, even if an embodiment is described with reference to a specific figure, reference numeral not appearing in the specific figure may be referred to if necessary, and the reference numeral not appearing in the specific figure is used when the reference numeral appears in the other figures.

Referring to FIG. 1, a display device 1 may include a display panel 11. The display panel 11 may display an image.

The display device 1 may include a first long side LS1, a second long side LS2 opposite to the first long side LS1, a first short side SS1 adjacent to the first long side LS1 and the second long side LS2, and a second short side SS2 opposite to the first short side SS1. Meanwhile, for convenience of explanation, it is illustrated and described that the first and second long sides LS1 and LS2 are longer than the first and second short sides SS1 and SS2, but it is also possible that lengths of the first and second long sides LS1 and LS2 may be approximately equal to lengths of the first and second short sides SS1 and SS2.

A direction parallel to the long sides LS1 and LS2 of the display device 1 may be referred to as an up-down direction. A direction parallel to the short sides SS1 and SS2 of the display device 1 may be referred to as a left-right direction. A direction perpendicular to the long sides LS1 and LS2 and the short sides SS1 and SS2 of the display device 1 may be referred to as a front-rear direction.

A side on which the display panel 11 displays an image may be referred to as a front side F, and a side opposite thereto may be referred to as a rear side R. The first short side SS1 may be referred to as an upper side U. The second short side SS2 may be referred to as a lower side D. The first long side LS1 may be referred to as a left side Le. The second long side LS2 may be referred to a right side Ri.

The first long side LS1, the second long side LS2, the first short side SS1, and the second short side SS2 may be referred to as edges of the display device 1. Further, positions where the first long side LS1, the second long side LS2, the first short side SS1, and the second short side SS2 meet each other may be referred to as corners.

For example, a position where the first short side SS1 and the first long side LS1 meet each other may be referred to as a first corner C1. A position where the first long side LS1 and the second short side SS2 meet each other may be referred to as a second corner C2. A position where the second short side SS2 and the second long side LS2 meet each other may be referred to as a third corner C3. A position where the second long side LS2 and the first short side SS1 meet each other may be referred to as a fourth corner C4.

Referring to FIGS. 2 and 3, a frame 20 may form the skeleton of the display device 1. The frame 20 may include an outer frame 21, a lower frame 22, an upper frame 23, and a guide frame 24. For example, the frame 20 may be bilaterally symmetrical about a reference line W' (see FIG. 19) that passes through the center of the display device and extends in the up-down direction. For example, the frame 20 may include a metal material.

The outer frame 21 may form a periphery of the frame 20 and may be a generally rectangular frame. A first outer frame 21*a* may form an upper side of the outer frame 21 and may be elongated in the left-right direction. A second outer frame 21*b* may form a lower side of the outer frame 21 and may be elongated in the left-right direction. A third outer frame 21*c* may form a left side of the outer frame 21 and may be elongated in the up-down direction. A fourth outer frame 21*d* may form a right side of the outer frame 21 and may be elongated in the up-down direction.

Further, the first corner C1 (see FIG. 1) may be formed at a position where the first outer frame 21*a* and the third outer frame 21*c* meet. The second corner C2 (see FIG. 1) may be formed at a position where the third outer frame 21*c* and the second outer frame 21*b* meet. The third corner C3 (see FIG. 1) may be formed at a position where the second outer frame 21*b* and the fourth outer frame 21*d* meet. The fourth corner C4 (see FIG. 1) may be formed at a position where the fourth outer frame 21*d* and the first outer frame 21*a* meet.

The lower frame 22 is elongated in the left-right direction between the third outer frame 21*c* and the fourth outer frame 21*d*, to be coupled or fixed to the third outer frame 21*c* and the fourth outer frame 21*d*. The lower frame 22 may be disposed closer to the second outer frame 21*b* than the first outer frame 21*a*.

The upper frame 23 may be disposed above the lower frame 22. The upper frame 23 may be disposed at the front of the guide frame 24 and a bar 25 which will be described below. For example, the upper frame 23 may be elongated in the left-right direction between the third outer frame 21*c* and the fourth outer frame 21*d*, to be coupled or fixed to the third outer frame 21*c* and the fourth outer frame 21*d*. In another example, the upper frame 23 may be elongated in the left-right direction between a first guide frame 24*a* and a second guide frame 24*b*, to be coupled or fixed to the first guide frame 24*a* and the second guide frame 24*b*. Meanwhile, the upper frame 23 may be referred to as a center frame.

The guide frame 24 may be elongated in the up-down direction between the first outer frame 21*a* and the lower frame 22. The first guide frame 24*a* may be coupled or fixed to the third outer frame 21*c* on the right side of the third outer frame 21*c*, and an upper end of the first guide frame 24*a* may be coupled or fixed to the first outer frame 21*a*. Further, a lower end of the first guide frame 24*a* may be coupled or fixed to the lower frame 22. The second guide frame 24*b* may be coupled or fixed to the fourth outer frame 21*d* on the left side of the fourth outer frame 21*d*, and an upper end of the second guide frame 24*b* may be coupled or fixed to the first outer frame 21*a*. Further, a lower end of the second guide frame 24*b* may be coupled or fixed to the lower frame 22.

Meanwhile, the bar 25 may be elongated in the up-down direction between the first outer frame 21*a* and the lower frame 22, to be coupled or fixed to the first outer frame 21*a* and the lower frame 22. For example, the bar 25 may include a first bar 25*a* and a second bar 25*b* which are spaced apart from each other in the left-right direction. For example, a single bar 25 may be provided which is disposed in the center of the frame 20, or three or more bars may be provided which are spaced apart from each other in the left-right direction. The bar 25 may be located on or adjacent to the reference line W' that passes through the center of the display device and extends in the up-down direction. Meanwhile, the bar 25 may be referred to as a vertical bar or a middle frame.

Referring to FIG. 4, the first outer frame 21*a* may include a vertical part 21V and a horizontal part 21H. The vertical part 21V and the horizontal part 21H may be elongated in the left-right direction along the edge of the first outer frame 21*a*.

The vertical part 21V may form an upper surface of the first outer frame 21*a*. A length of the vertical part 21V may be defined in the left-right direction, a width of the vertical part 21V may be defined in the front-rear direction, and a thickness of the vertical part 21V may be defined in the up-down direction.

The horizontal part 21H may be disposed on the inside of the vertical part 21V. The horizontal part 21H may protrude from the inside of the vertical part 21V in a direction intersecting the horizontal part 21H. For example, the horizontal part 21H may be orthogonal to the vertical part 21V. A length of the horizontal part 21H may be defined in the left-right direction, a width of the horizontal part 21H may be defined in the up-down direction, and a thickness of the horizontal part 21H may be defined in the front-rear direction.

The third outer frame 21*c* may include a side part 21S and a flat plate part 21P. The side part 21S and the flat plate part 21P may be elongated in the up-down direction along the edge of the third outer frame 21*c*.

The side part 21S may form a left side surface of the third outer frame 21*c*. A length of the side part 21S may be defined in the up-down direction, a width of the side part 21S may be defined in the front-rear direction, and a thickness of the side part 21S may be defined in the left-right direction. The side part 21S may intersect the vertical part 21V of the second outer frame 21*c*. That is, the vertical part 21V may form an upper side of the display device, the side part 21S may form a left side of the display device, and the first corner C1 may be formed at a position where the vertical part 21V and the side part 21S meet.

The flat plate part 21P may be disposed on the inside of the side part 21S. The flat plate part 21P may protrude from the inside of the side part 21S in a direction intersecting the side part 21S. For example, the flat plate part 21P may be orthogonal to the side part 21S. The flat plate part 21P may be disposed parallel to the horizontal part 21H of the first outer frame 21*c*. A length of the flat plate part 21P may be defined in the up-down direction, a width of the flat plate part 21P may be defined in the left-right direction, and a thickness of the flat plate part 21P may be defined in the front-rear direction.

A first reinforcing part 215 may be disposed at an upper portion of the flat plate part 21P. The first reinforcing part 215 may protrude forward from a front surface of the flat plate part 21P. For example, the first reinforcing part 215 may include at least one rib. A first tilted rib 215*a* may protrude from the front surface of the flat plate part 21P in a direction intersecting the flat plate part 21P and the side part 21S. A first vertical rib 215*b* may be disposed between the first tilted rib 215*a* and the side part 21*s* and may protrude from the front surface of the flat plate part 21P in a direction perpendicular to the flat plate part 21P. A first horizontal rib 215*c* may be connected to a front end of the first tilted rib 215*a* and a front end of the first vertical rib 215*b* and may be disposed parallel to the flat plate part 21P. A first gap rib 215 may be disposed between the first horizontal rib 215*c* and the side part 21S and may be orthogonal to the side part 21S.

A second reinforcing part 216 may be disposed at a lower portion of the flat plate part 21P. The second reinforcing part 216 may protrude forward from the front surface of the flat plate part 21P. For example, the second reinforcing part 216 may include at least one rib. A second tilted rib 216*a* may protrude from the front surface of the flat plate part 21P in a direction intersecting the flat plate part 21P and the side part 21S. That is, the side part 21S, the flat plate part 21P, and the second tilted rib 216*a* may form a triangular cross-section. A second protruding rib 216*b* may protrude from the inside of the side part 21S toward the second tilted rib 216*a*. A second horizontal rib 216*c* may protrude from an upper end of the second tilted rib 216*a* toward the first reinforcing part 215 and may be disposed parallel to the flat plate part 21P. A second gap rib 216*d* may be disposed between the second horizontal rib 216*c* and the side part 21S and may be orthogonal to the side part 21S.

Accordingly, the first reinforcing part 215 and the second reinforcing part 216 may reinforce the rigidity of the third outer frame 21*c* and may minimize bending or torsion thereof.

Meanwhile, a fastening hole 21Hh may be formed at a portion adjacent to a left end of the horizontal part 21H of the first outer frame 21*a*. In addition, an upper end of the first horizontal rib 215*c* of the third outer frame 21*c* may be disposed at the rear of the left end of the horizontal part 21H. In other words, the horizontal part 21H may be seated on a front surface of the first horizontal rib 215*c*. In this case, a fastening member, such as a screw, may pass through the fastening hole 21Hh, to be fastened to the first horizontal rib 215*c*.

Accordingly, the third outer frame 21*c* may be detachably coupled to the left end of the first outer frame 21*a* at a lower side of the first outer frame 21*a*. In this case, a coupling structure between the third outer frame 21*c* and the first outer frame 21*a* may be located inside the third outer frame 21*c* and the first outer frame 21*a*, without being exposed to the outside.

The fourth outer frame 21*d* (see FIG. 3) and the third outer frame 21*c* may be bilaterally symmetrical to each other. That is, the description of the structure of the third outer frame 21*c* described above and the coupling structure of the third outer frame 21*c* to the first outer frame 21*a* may also apply to the structure of the fourth outer frame 21*d* and the coupling structure of the fourth outer frame 21*d* to the first outer frame 21*a*.

Referring to FIGS. 5 and 6, a frame hole 217 may be formed within the side part 21S, the flat plate part 21P, and the second tilted rib 216*a* and may be opened at the rear side and the lower side of the third outer frame 21*c*.

An inner sleeve 218 may be inserted into the frame hole 217 (see FIG. 4) and may be opened at the rear side and the lower side of the third outer frame 21*c*. A plurality of protrusions (not numbered) may be formed on the inside of the inner sleeve 218.

An outer sleeve 219 may be detachably coupled to the inner sleeve 218 at the rear of the inner sleeve 218 and may cover the rear side of the inner sleeve 218.

Accordingly, a cable and the like may be disposed in a space 218*a* (see FIG. 21) formed between the inner sleeve 218 and the outer sleeve 219.

Referring to FIGS. 7 and 8, the first guide frame 24*a* may be elongated in the up-down direction between the horizontal part 21H of the first outer frame 21*a* and the second reinforcing part 216. The first guide frame 24*a* may be disposed at the front of the flat plate part 21P and may be disposed parallel to the flat plate part 21P. The first guide frame 24*a* may include a first part 241, a second part 242, and a third part 243.

The first part 241 may be next to the side part 21S, and at least a portion of the first part 241 may face the flat plate part 21P. The second part 242 may be stepped with respect to the first part 241. The third part 243 may be stepped with respect to the second part 242. The first part 241, the second part 242, and the third part 243 may be formed as one body. For example, the second part 242 may be formed by pressing a portion between the left and right sides of the first guide frame 24*a* toward the rear. Accordingly, bending stiffness and/or torsional stiffness of the first guide frame 24*a* may be improved. Further, an upper end of the third part 243 may be coupled or fixed to the horizontal part 21H.

Meanwhile, a first fastening hole **215*h*1 and a second fastening hole 215*h*2 may be formed by penetrating the first horizontal rib 215*c* in the front-rear direction (see FIG. 4). The first fastening hole 215*h*1 may be adjacent to an upper end of the first horizontal rib 215*c*, and the second fastening hole 215*h*2 may be adjacent to a lower end of the first horizontal rib 215*c*. A third fastening hole 216*h* may be formed by penetrating the second horizontal rib 216*c* in the front-rear direction (see FIG. 4). The second fastening hole 215*h*2 may be formed between the first fastening hole 215*h*1 and the third fastening hole 216*h*. Meanwhile, the first fastening hole 215*h*1 may be referred to as an upper fastening hole, and the second hole 215*h*2 may be referred to as a middle fastening hole, and the third hole 216*h*** may be referred to as a lower fastening hole.

Further, at least a portion of the first part 241 of the first guide frame **24*a* may be seated on a front surface of the first horizontal rib 215*c* and the second horizontal rib 216*c*. A first hole 24*h*1, a second hole 24*h*2, and a third hole 24*h*3 may be formed by penetrating the first part 241 in the front-rear direction and may be spaced apart from each other in the up-down direction. The first hole 24*h*1 may be aligned with the first fastening hole 215*h*1 (see FIG. 4), the second hole 24*h*2 may be aligned with the second fastening hole 215*h*2 (see FIG. 4), and the third hole 24*h*3 may be aligned with the third fastening hole 216*h* (see FIG. 4). In this case, a fastening member or a guide member may pass through the holes 24*h*1, 24*h*2, and 24*h*3, to be fastened to or inserted into the fastening holes 215*h*1, 215*h*2, and 216*h***.

In addition, a first gap ga may be formed between the first part 241 of the first guide frame **24*a* and the side part 21S of the third outer frame 24*c*. The first gap ga may be equal to the width of the first gap rib 215*d* and the width of the second gap rib 216*d***.

The second guide frame **24*b* (see FIG. 3) and the first guide frame 24*a* may be bilaterally symmetrical to each other. That is, the description of the structure of the first guide frame 24*a*, which is described above and will be described below, and the coupling structure of the first guide frame 24*a* to the third outer frame 21*c* may also apply to the structure of the second guide frame 24*b* and the coupling structure of the second guide frame 24*b* to the fourth outer frame 21*d* (see FIG. 3**).

Referring to FIGS. 4 and 9, a fastening member **24*f* may pass through the holes 24*h*1, 24*h*2, and 24*h*3 to be fastened to the fastening holes 215*h*1, 215*h*2, and 216*h*. For example, the fastening member 24*f*** may be a screw.

Accordingly, the first guide frame **24*a* may be detachably coupled to the third outer frame 21*c* at the front of the third outer frame 21*c* and at the upper side of the second reinforcing part 216. That is, the first outer frame 21*a*, the third outer frame 21*c*, and the first guide frame 24*a*** are coupled to each other to improve the rigidity of the display device.

Referring to FIGS. 4 and 10, a guide member **24*f*' may pass through the holes 24*h*1, 24*h*2, and 24*h*3 to be inserted into the fastening holes 215*h*1, 215*h*2, and 216*h*. For example, the guide member 24*f*'** may be a pin elongated in the front-rear direction and having a cylindrical shape.

Accordingly, the first guide frame **24*a* may be detachably coupled to the third outer frame 21*c* at the front of the third outer frame 21*c* and at the upper side of the second reinforcing part 216. That is, the guide member 24*f*' may guide coupling of the first guide frame 24*a* to the third outer frame 21*c*. Meanwhile, separately from the guide member 24*f*', the first guide frame 24*a* may be fixed to the third outer frame 21*c* by a fastening member such as a screw. That is, the first outer frame 21*a*, the third outer frame 21*c*, and the first guide frame 24*a*** are coupled to each other to improve the rigidity of the display device.

Referring to FIGS. 4 and 11, a guide member **24*f*" may pass through the holes 24*h*1, 24*h*2, and 24*h*3 to be inserted into the fastening holes 215*h*1, 215*h*2, and 216*h***.

For example, the guide member **24*f*" may be elongated in the front-rear direction and may have a cylindrical shape. Further, the guide member 24*f*" may be an elastic spring pin having a first end and a second end which are spaced apart from each other in a circumferential direction of the guide member 24*f*". A diameter of the guide member 24*f*" decreases due to an external force, the first end and the second end may be engaged with each other or contact each other, and if the external force is removed, the diameter of the guide member 24*f*" increases again due to a restoring force, and the first end and the second end may be moved away from each other. In this case, the guide member 24*f*" may come into close contact with a portion of the first guide frame 24*a* that forms a boundary of the holes 24*h*1, 24*h*2, and 24*h*3, and a portion of the first horizontal rib 215*c* that forms a boundary of the fastening holes 215*h*1, 215*h*2, and 216*h*. That is, by using the guide member 24*f*", relative movement of the first guide frame 24*a* with respect to the third outer frame 24*c* may be minimized, and the first guide frame 24 may be integrally coupled to the third outer frame 24*c***.

Accordingly, the first guide frame **24*a* may be detachably coupled to the third outer frame 21*c* at the front of the third outer frame 21*c* and at an upper side of the second reinforcing part 216. That is, the guide member 24*f*" may guide coupling of the first guide frame 24*a* to the third outer frame 21*c*. Meanwhile, separately from the guide member 24*f*", the first guide frame 24*a* may be fixed to the third outer frame 21*c* by a fastening member such as a screw. That is, the first outer frame 21*a*, the third outer frame 21*c*, and the first guide frame 24*a*** are coupled to each other to improve the rigidity of the display device.

Referring to FIGS. 12 and 13, a display unit 10 of the display device may include the display panel 11, a middle cabinet 12, a plate 13, a module cover 14, and a back cover 15.

For example, the display panel 11 may be an OLED panel, an LCD panel, or an LED panel. The display panel 11 may divide an image into a plurality of pixels and may output the image while controlling color, brightness, and chroma of the respective pixels. The display panel 11 may be divided into an active area, in which the image is displayed, and a de-active area in which the image is not displayed. The display panel 11 may generate light corresponding to red, green, or blue color in response to a control signal. Meanwhile, the display panel 11 may be implemented with various panels such as LCD and the like.

The middle cabinet 12 may be coupled to the display panel 11 at the rear of the display panel 11. The middle cabinet 12 may form a side surface of the display unit 10. The middle cabinet 12 may cover the side surface of the display panel 11. The middle cabinet 12 may be a square frame. For example, the middle cabinet 12 may include a metal material or a plastic material.

For example, the middle cabinet 12 may include a side part 12V and a rear part 12H. The side part 12V may form a side surface of the middle cabinet 12. A portion of the side part 12V may cover the side surface of the display panel 11. The rear part 12H may be disposed inside the side part 12V. The rear part 12H may cover a portion of the rear side of the display panel 11. Meanwhile, a gap pad 12*a* may be provided on a rear surface of the rear part 12H, to face the outer frame 21.

The plate 13 may be coupled to the display panel 11 at the rear of the display panel 11. In this case, an adhesive member T may be coupled to the display panel 11 and the plate 13 between the display panel 11 and the plate 13. For example, the adhesive member T may be double-sided tape.

The module cover 14 may be coupled or fixed to the plate 13 at the rear of the plate 13. That is, the module cover 14 may cover the rear side of the plate 13. The module cover 14 and the plate 13 may be disposed between the display panel 11 and the rear part 12H. A printed circuit board (PCB) or electronic parts may be installed on a rear surface of the module cover 14. For example, the module cover 14 may include a metal material. A rigid part 14*a* may be formed by being pressed from a front surface of the module cover 14 toward the rear thereof. Accordingly, the rigid part 14*a* may improve the torsional stiffness and/or bending stiffness of the module cover 14. Meanwhile, the module cover 14 may be referred to as a main frame or an inner frame.

The back cover 15 may cover the rear side of the module cover 14. The back cover 15 may form a portion of the rear surface of the display device 1. For example, the back cover 15 may include a metal material or a plastic material.

Meanwhile, the first outer frame 21*a* may include the vertical part 21V and the horizontal part 21H. The vertical part 21V and the horizontal part 21H may be elongated in the left-right direction along the edge of the first outer frame 21*a*.

The vertical part 21V may form an upper surface of the first outer frame 21*a*. The vertical part 21V may have a width in a direction intersecting the display unit 10. In other words, a length of the vertical part 21V may be defined in the left-right direction, a width of the vertical part 21V may be defined in the front-rear direction, and a thickness of the vertical part 21V may be defined in the up-down direction. A portion of the vertical part 21V may cover the side surface of the display unit 10.

The horizontal part 21H may be disposed under the vertical part 21V. The horizontal part 21H may be disposed parallel to the display unit 10 at the rear of the display unit 10. In other words, a length of the horizontal part 21H may be defined in the left-right direction, a width of the horizontal part 21H may be defined in the up-down direction, and a thickness of the horizontal part 2H may be defined in the front-rear direction. The horizontal part 21H may cover a portion of the rear side of the display unit 10.

For example, the horizontal part 21H may include a first horizontal part 21Ha, a second horizontal part 21Hb, and a third horizontal part 21Hc which are spaced apart from each other in the front-rear direction. In this case, a width of the first horizontal part 21Ha may be greater than a width of the second horizontal part 21Hb, and a width of the third horizontal part 21Hc may be smaller that the width of the second horizontal part 21Hb. Further, the first horizontal part 21Ha may be bent at least twice.

A coupling part 210 may form a portion of the first horizontal part 21Ha and may form a rearmost surface of the first horizontal part 21Ha. The second part 242 of the first guide frame 24*a* may contact the inside of the coupling part 210. A first fixing part 14*b*1 may protrude rearward, i.e., a direction from the rigid part 14*a* toward the second part 242 of the first guide frame 24*a*.

The first fixing part 14*b*1, the second part 242, and the coupling part 210 may be coupled to each other by a fastening member. For example, a first guide hole 24*g*1 may be formed through the second part 242, and a first coupling hole 211 may be formed through the coupling part 210. In this case, the first guide hole 24*g*1 and the first coupling hole 211 may be aligned with the first fixing part 14*b*1, and the first fixing part 14*b*1 may be a pem-nut fastened to a screw. Meanwhile, the coupling structure of the module cover 14 and the first guide frame 24*a* to the first outer frame 21*a* by the first fixing part 14*b*1 described above may also apply to the coupling structure of the module cover 14 and the second guide frame 24*b* (see FIG. 3) to the first outer frame 21*a*.

Accordingly, by using the fixing part provided for the rigid part 14*a*, the display unit 10 may be coupled to the guide frames 24*a* and 24*b* and the first outer frame 21*a*, thereby improving the torsional stiffness and/or bending stiffness of the display device.

Referring to FIGS. 12 and 14, the first fixing part 14*b*1 may be adjacent to the upper side of the module cover 14, and a second fixing part 14*b*2 may be disposed below the first fixing part 14*b*1. The second fixing part 14*b*2 may protrude rearward, i.e., a direction from the rigid part 14*a* toward the second part 242 of the first guide frame 24*a*.

The second fixing part 14*b*2 and the second part 242 may be coupled to each other by a fastening member. For example, a second guide hole 24*g*2 may be formed through the second part 242 and may be aligned with the second fixing part 14*b*2, and the second fixing part 14*b*2 may be a pem-nut fastened to a screw. Meanwhile, the coupling structure between the module cover 14 and the first guide frame 24*a* by the second fixing part 14*b*2 described above may also apply to the coupling structure between the module cover 14 and the second guide frame 24*b* (see FIG. 3).

Accordingly, by using the fixing part provided for the rigid part 14*a*, the display unit 10 may be coupled to the guide frames 24*a* and 24*b*, thereby improving the torsional stiffness and/or bending stiffness of the display device.

Referring to FIGS. 12 and 15, a third fixing part 14*b*3 may be disposed below the second fixing part 14*b*2 and may be adjacent to the lower side of the module cover 14. The third fixing part 14*b*3 may protrude rearward, i.e., a direction from the rigid part 14*a* toward the second part 242 of the first guide frame 24*a*.

The third fixing part 14*b*3 and the second part 242 may be coupled to each other by a fastening member. For example, a third guide hole 24*g*3 may be formed through the second part 242 and may be aligned with the third fixing part 14*b*3, and the third fixing part 14*b*3 may be a pem-nut fastened to a screw. Meanwhile, the coupling structure between the module cover 14 and the first guide frame 24*a* by the third fixing part 14*b*3 described above may also apply to the coupling structure between the module cover 14 and the second guide frame 24*b* (see FIG. 3).

Accordingly, by using the fixing part provided for the rigid part 14*a*, the display unit 10 may be coupled to the guide frames 24*a* and 24*b*, thereby improving the torsional stiffness and/or bending stiffness of the display device.

Referring to FIG. 16, a lower end 24*e* of the first guide frame 24*a* may be inserted into and fixed to the lower frame 22. Accordingly, the rigidity of a lower part of the first guide frame 24*a* may be improved.

Referring to FIGS. 17 and 18, a mount 70 may be coupled to the coupling part 210 at the rear of the coupling part 210. In this case, the coupling part 210 may be coupled to the module cover 14 and the mount 70 between the module cover 14 and the mount 70.

A fixing part 14*c* may protrude from the rigid part 14*a* of the module cover 14 toward the coupling part 210, and a portion of the fixing part 14*c* may be inserted into the coupling part 210. The fixing part 14*c*, the coupling part 210, and the mount 70 may be coupled to each other by a fastening member. For example, a coupling hole 212 may be formed through the coupling part 210, and a mount hole 711 may be formed through the mount 70. In this case, the coupling hole 212 and the mount hole 711 are aligned with the fixing part 14*c* in the front-rear direction, and the fixing part 14*c* may be a pem-nut fastened to a screw.

Accordingly, the mount 70 may be integrally coupled to the first outer frame 21*a* and the module cover 14. In addition, as the fixing part 14*c* is provided for the rigid part 14*a*, the torsional stiffness and/or bending stiffness of the first outer frame 21*a* may be improved.

A seating part 213*a* may be lowered from a rear surface of the coupling part 210 to the front and may be elongated in the left-right direction. A thickness of a lower end 213*a*1 of the seating part 213*a* may be smaller than a thickness of a portion of the coupling part 210 at which the seating part 213*a* is not formed. In a longitudinal direction of the seating part 213*a*, a distal end 213*a*2 of the seating part 213*a* may be stepped with respect to the portion of the coupling part 210 at which the seating part 213*a* is not formed. Meanwhile, the distal end 213*a*2 of the seating part 213*a* may be a left end 213*a*2 or a right end 213*a*2 of the seating part 213*a*.

The mount 70 may include a contact part 70*a* and a flat plate part 70*b*.

The contact part 70 may contact the rear surface of the seating part 213*a*. For example, a front boss 70*aa* may protrude from the contact part 70*a* toward the seating part 213*a*, to be inserted into an insertion groove formed in a rear surface of the seating part 213*a*. In another example, the front boss may protrude from the seating part 213*a* toward the contact part 70*a*, to be inserted into an insertion groove formed in a front surface of the contact part 70*a*. Accordingly, the coupling of the contact part 70*a* to the seating part 213*a* may be guided. Meanwhile, the contact part 70*a* may be screw-coupled to the seating part 213*a* near the front boss 70*aa*.

The flat plate part 70*b* may be lowered from the contact part 70*b* to the front and may face a rear surface of the module cover 14. In this case, a stepped portion (not numbered) may be formed between the contact part 70*a* and the flat plate part 70*b* and may contact or engage with the lower end 213*a*1 of the seating part 213*a*. Accordingly, the coupling of the mount 70 to the seating part 213*a* may be guided.

The bar 25 may be coupled to the seating part 213*a* and the mount 70 at the rear of the seating part 213*a* and the mount 70. The bar 25 may be elongated in the up-down direction. For example, the bar 25 may include a first bar 25*a* (see FIG. 3) and a second bar 25*b* which are spaced apart from each other in the left-right direction. The first bar 25*a* may be next to the left side of the mount 70 and may be coupled to the seating part 213*a* and the mount 70. The second bar 25*b* may be next to the right side of the mount 70 and may be coupled to the seating part 213*a* and the mount 70.

Referring to FIG. 19, the module cover 14 may be disposed between the third outer frame 21*c* and the fourth outer frame 21*d*. The module cover 14 may be disposed at the front of the bar 25. An upper end of the module cover 14 may be coupled to the first outer frame 21*a*, and a lower end of the module cover 14 may be coupled to the upper frame 23.

Electronic parts may be mounted on the rear surface of the module cover 14. A first board E1, a second board E2, and a third board E3 may be spaced apart from each other, but electrically connected to each other, and may be mounted on the rear surface of the module cover 14.

The first board E1 may be a power supply board that supplies power to each component of the display device 1. The second board E2 may be a timing controller board that provides an image signal to the display panel 11 (see FIG. 5). In this case, a cable hole CH may be formed through the module cover 14 at a position adjacent to the lower end of the module cover 14, and a cable (not shown) may be connected to the second board E2 and the display panel 11 through the cable hole CH. The third board E3 may be a main board that controls each component of the display device 1.

A speaker SPK may be fixed on the lower frame 22 at a position between the upper frame 23 and the lower frame 22 and may provide sound to the front of the display device. For example, a left speaker may be disposed between the third outer frame 21*c* and the first bar 25*a*, and a right speaker may be disposed between the fourth outer frame 21*d* and the second bar 25*b*.

Referring to FIGS. 19 and 20, a supporter 30 may be elongated in the up-down direction. The supporter 30 may include a first part 31, a second part 32, and a third part 33. For example, the supporter 30 may include a metal or plastic material.

The first part 31 may form the front surface of the supporter 30 and may define a total length of the supporter 30. The second part 32 may be bent rearward from the first part 41 and may form a side surface of the supporter 30. The second part 32 may be disposed closer to an upper end of the first part 31 than a lower end thereof. For example, an upper end of the second part 32 may be connected to the upper end of the first part 31, and a length of the second part 32 may be about half (½) of a length of the first part 31. The third part 33 may be bent to the right or left from the second part 32 to face the first part 31. In this case, the third part 33 may be spaced rearward from the first part 31. For example, the first part 31, the second part 32, and the third part 33 may be formed as one body. In another example, the first part 31, the second part 32, and the third part 33 may be provided separately and may be coupled to each other by screw coupling, welding, and the like.

A supporter hole 312 may be formed by penetrating the first part 31 in the front-rear direction. For example, the supporter hole 312 may be provided as a pair of holes spaced apart from each other in the left-right direction. For example, the supporter hole 312 may include supporter holes 312*a*, 312*b*, and 312*c* which are spaced apart from each other in a longitudinal direction of the first part 31. The first supporter hole 312*a* may be adjacent to the upper end of the first part 31, the third supporter hole 312*c* may be adjacent to the lower end of the first part 31, and the second supporter hole 312*b* may be disposed between the first supporter hole 312*a* and the third supporter hole 312*c*.

The supporter 30 may include a first supporter 30*a* and a second supporter 30*b* which are spaced apart from each other in the left-right direction. The first supporter 30*a* may be next to the third outer frame 21*c*, and the second supporter 30*b* may be next to the fourth outer frame 21*d*. The second part 32 of the first supporter 30*a* may be provided at a left end of the first part 31, and the third part 33 of the first supporter 30*a* may be bent to the right from the second part 32. The second part 32 of the second supporter 30*b* may be provided at a right end of the first part 31, and the third part 33 of the second supporter 30*b* may be bent to the left from the second part 32.

For example, the first supporter 30*a* and the second supporter 30*b* may be bilaterally symmetrical to each other about the reference line VV' passing through the center of the display device and extending in the up-down direction.

Referring to FIGS. 19 and 21, the first supporter 30*a* may surround a portion of the first guide frame 24*a* on the left side of the first guide frame 24*a*. Meanwhile, the description of the first support 30*a* for the first guide frame 24*a* described above may also apply to the description of the second supporter 30*b* for the second guide frame 24*b*.

Referring to FIG. 22, the supporter 30 may be detachably coupled to a cover assembly 40 at the rear of the cover assembly 40. The cover assembly 40 may include a cover base 41, a cover body 42, and a cover 43. For example, the cover assembly 40 may include a metal or plastic material.

The cover base 41 may be a substantially rectangular plate. A base hole 411 may be formed by penetrating the cover base 41 in the front-rear direction and may face the speaker SPK. The first supporter 30*a* may be adjacent to the left side of the cover base 41, and a first part 311 of the first supporter 30*a* may contact a rear surface of the cover base 41. In this case, a fastening member (not shown), such as a screw, may penetrate a hole 412 of the cover base 41 from the front of the cover base 41, to be fastened to the supporter hole 312 of the first supporter 30*a*. The second supporter 30*b* may be adjacent to the right side of the cover base 41, and the first part 311 of the second supporter 30*b* may contact the rear surface of the cover base 41. In this case, a fastening member (not shown), such as a screw, may penetrate the hole 412 of the cover base 41 from the front of the cover base 41, to be fastened to the supporter hole 312 of the second supporter 30*b*. Meanwhile, the cover base 41 may be disposed at the front of the display unit 10 (see FIG. 1).

The cover body 42 may be detachably coupled to the cover base 41 at the front of the cover base 41. A body hole 421 may be formed by penetrating the cover body 42 in the front-rear direction and may face the base hole 411. For example, the body hole 421 may be provided with small holes.

The cover 43 may be detachably coupled to the cover body 42 at the front of the cover body 42. For example, the cover 43 may include a fabric material. Meanwhile, the cover 43 may be referred to as jersey.

Referring to FIGS. 23 and 24, the third outer frame 21*c* may cover the side surface and the rear surface of the first supporter 30*a*, and the cover assembly 40: 41, 42, 43 may cover the front of the first supporter 30*a*. The first gap ga may be formed between the third outer frame 21*c* and the first guide frame 24*a*. That is, the second part 32 of the first supporter 30*a* may be disposed in the first gap ga, and the first supporter 30*a* and the cover assembly 40 may be disposed to be movable up and down relative to the third outer frame 21*c* and the first guide frame 24*a*.

In this case, the first supporter 30*a* may surround a portion of the first guide frame 24*a*. In other words, a second gap gb may be formed between the first part 31 and the third part 33 of the first supporter 30*a*, and a portion of the first guide frame 24*a* may be disposed in the second gap gb.

Meanwhile, the description of the first supporter 30*a* for the third outer frame 21*c* and the first guide frame 24*a* described above may also apply to the description of the second supporter 30*b* for the fourth outer frame 21*d* and the second guide frame 24*b* (see FIG. 19).

Referring to FIGS. 24 and 25, a first lift assembly 60*a* may be disposed at the rear of the first guide frame 24*a* and may be installed on the lower frame 22. The first lift assembly 60*a* may provide power to the first supporter 30*a*. Specifically, the first lift assembly 60*a* may include a motor 61, a motor mount 62, a torque limiter 63, a worm 64, a worm wheel 65, a lead screw 51, a connector 52, and a cap 53.

The motor 61 may provide torque. The motor 61 may be installed on the lower frame 22 through the motor mount 62. The torque limiter 63 may be connected to a rotating shaft of the motor 61 to limit the torque of the motor.

The worm 64 may be fixed to the rotating shaft of the motor 61 and may rotate together with the rotating shaft. For example, the worm 64 may extend in the left-right direction and rotate about an axis parallel to the left-right direction. The worm wheel 65 may be engaged with a thread formed on the outer circumferential surface of the worm 64. The worm wheel 65 may extend in the up-down direction and may rotate about an axis parallel to the up-down direction.

The lead screw 51 may be elongated in the up-down direction, and a lower end of the lead screw 51 may be fixed to the worm wheel 65. A male thread may be formed on the outer circumferential surface of the lead screw 51.

The connector 52 may have a generally block shape. A connector hole (not numbered) may be formed by penetrating the connector 52 in the up-down direction, and the lead screw 51 may pass through the connector hole. A female thread may be formed at a portion that forms a boundary of the connector hole of the connector 52 and engaged with the male thread. One side of the connector 52 may be coupled or fixed to the third part 33 of the first supporter 30*a*.

The cap 53 may be provided at an upper side of the connector 52. The cap 53 may have a generally ring shape. The lead screw 51 may pass through the connector hole and the cap 53.

A rail 245 may protrude from a rear surface of the first part 241 (see FIG. 8) of the first guide frame 24*a* toward the third part 33 of the first supporter 30*a* and may be spaced apart from the third part 33. The rail 245 may be elongated in the up-down direction. The rail 245 may be generally H-beam or I-beam in shape. The rail 245 may guide up-and-down movement of a slider 34 which will be described below.

The slider 34 may be provided on a front surface of the third part 33 of the first supporter 30*a*, and the slider 34 may surround a portion of the rail 245. That is, the slider 34 may be coupled to the rail 245 so as to be movable up and down. For example, the slider 34 may include at least two sliders which are spaced apart from each other in the up-down direction.

Accordingly, when the motor 61 is driven, the first supporter 30*a* may move up and down along the lead screw 51.

Meanwhile, a second lift assembly 60*b* may be disposed at the rear of the second guide frame 24*b* and may be installed on the lower frame 22 (see FIG. 19). The second lift assembly 60*b* may provide power to the second supporter 30*b*. The second lift assembly 60*b* and the first lift assembly 60*a* may be bilaterally symmetrical to each other about the reference line W' (see FIG. 19).

Accordingly, in response to the operation of the first lift assembly 60*a* and the second assembly 60*b*, the cover assembly 40 fixed to the first supporter 30*a* and the second supporter 30*b* may be raised or lowered.

Referring to FIG. 26, a stopper 54 may be fixed to the first guide frame 24*a* at the rear of the first guide frame 24*a*. An upper end of the lead screw 51 may be rotatably coupled to a lower side of the stopper 54. The cap 53 may face the lower side of the stopper 54 and may be detachably coupled to the lower side of the stopper 54. Meanwhile, the stopper 54 may be referred to as a holder.

Accordingly, when the cap 53 is coupled to the stopper 54, the stopper 54 may limit upward movement Mv of the connector 52 corresponding to the rotation of the lead screw 51.

Referring to FIG. 27, the cover 43 may move up and down at the front of the display panel 11.

Referring to the left view in FIG. 27, when the display device is in a first state, the cover 43 may not cover the display panel 11. In this case, a height h1 of an area exposed to the front of the display panel 11 may be a total height of the display panel 11.

Referring to the right view in FIG. 27, when the display device is in a second state, the cover 43 may cover at least a portion of the display panel 11. In this case, a height h2 of an area exposed to the front of the display panel 11 may be smaller than the total height of the display panel 11.

That is, the cover 43 may gradually cover the display panel 11 while moving up or may gradually expose the display panel 11 while moving down.

According to an aspect of the present disclosure, there is provided a display device including: a module cover; a display panel coupled to the module cover at a front of the module cover; an outer frame surrounding a side surface of the module cover; a guide frame elongated and disposed behind the module cover adjacent to the outer frame; and a cover assembly disposed in front of the display panel, and coupled to the guide frame to be movable in a longitudinal direction of the guide frame, wherein the guide fame is coupled to the outer frame and the module cover.

According to another aspect of the present disclosure, the outer frame may include: a first outer frame adjacent to one side of the module cover; a second outer frame opposite the first outer frame with respect to the module cover; a third outer frame adjacent to another side of the module cover; and a fourth outer frame opposite the third outer frame with respect to the module cover, wherein the guide frame may include: a first guide frame next to the third outer frame and coupled to the third outer frame; and a second guide frame next to the fourth outer frame and coupled to the fourth outer frame.

According to another aspect of the present disclosure, the first outer frame may further include: a vertical part extending along an edge of the first outer frame; and a horizontal part protruding from an inside of the vertical part in a direction intersecting the vertical part, wherein the third outer frame may be coupled to one end of the horizontal part, and the fourth outer frame may be coupled to the other end of the horizontal part.

According to another aspect of the present disclosure, the third outer frame and the fourth outer frame may be symmetrical to each other with respect to the first outer frame; and the first guide frame and the second guide frame may be symmetrical to each other with respect to the first outer frame.

According to another aspect of the present disclosure, the third outer frame may further include: a side part extending along an edge of the third outer frame; a flat plate part protruding from an inside of the side part in a direction intersecting the side part; and a reinforcing part extending between the flat plate part and the side part in a direction intersecting the flat plate part and the side part, wherein a portion of the reinforcing part may be coupled to the one end of the horizontal part.

According to another aspect of the present disclosure, the reinforcing part may include a horizontal rib disposed parallel to the horizontal part, wherein the first guide frame may be coupled to the horizontal rib, and a first gap may be formed between the first guide frame and the side part.

According to another aspect of the present disclosure, the display device may further include at least one of a guide member or a fastening member which is inserted into the first guide frame and the horizontal rib, wherein the guide member may include a spring pin having elasticity and including one end and the other end which are spaced apart from each other in a circumferential direction of the guide member.

According to another aspect of the present disclosure, the outer frame may further include a coupling part protruding from an inside of the outer frame toward a rear of the module cover, wherein the guide frame may be disposed between the module cover and the coupling part and coupled to the module cover and the coupling part.

According to another aspect of the present disclosure, the module cover may include: a rigid part formed by being pressed from a front surface of the module cover toward a rear thereof; and a first fixing part protruding from the rigid part toward the guide frame, wherein the guide frame may be disposed between the first fixing part and the coupling part and coupled to the first fixing part and the coupling part.

According to another aspect of the present disclosure, the module cover may further include a second fixing part and a third fixing part which protrude from the rigid part toward the guide frame and are coupled to the guide frame, wherein: the first fixing part may be adjacent to an upper side of the module cover; the third fixing part may be adjacent to a lower side of the module cover; and the second fixing part may be disposed between the first fixing part and the second fixing part.

According to another aspect of the present disclosure, the guide frame may include: a first part seated on the outer frame; and a second part formed by being pressed from the first part, and coupled to the first fixing part, the second fixing part, and the third fixing part.

According to another aspect of the present disclosure, the display device may further include a supporter which surrounds a portion of the guide frame, and to which the cover assembly is coupled, wherein a portion of the supporter may be disposed in a first gap between the guide frame and the outer frame, and the supporter may be coupled to the guide frame to be movable in a longitudinal direction of the guide frame.

According to another aspect of the present disclosure, the supporter further may include: a first part which is disposed at a front of the guide frame, and to which the cover assembly is coupled; a second part bent rearward from the first part and disposed in the first gap; and a third part bent from the second part toward a rear of the guide frame, wherein the third part may be movably coupled to the guide frame.

According to another aspect of the present disclosure, the supporter may include a slider provided on a surface of the third part that faces the first part, wherein a portion of the guide frame may be disposed in a second gap between the first part and the third part, and the guide frame may include a rail protruding from the guide frame toward the third part, and guiding movement of the slider.

According to another aspect of the present disclosure, the display device may further include a lift assembly providing power to the cover assembly, wherein the cover assembly may open or close at least a portion of a front surface of the display panel.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:

a module cover;

a display panel coupled to the module cover at a front of the module cover;

an outer frame surrounding a side surface of the module cover;

a guide frame elongated and disposed behind the module cover adjacent to the outer frame; and a cover assembly disposed in front of the display panel, and coupled to the guide frame to be movable in a longitudinal direction of the guide frame, wherein the guide fame is coupled to the outer frame and the module cover.

2. The display device of claim 1, wherein the outer frame comprises:

a first outer frame adjacent to one side of the module cover;

a second outer frame opposite the first outer frame with respect to the module cover;

a third outer frame adjacent to another side of the module cover; and a fourth outer frame opposite the third outer frame with respect to the module cover, wherein the guide frame comprises:

a first guide frame next to the third outer frame and coupled to the third outer frame; and a second guide frame next to the fourth outer frame and coupled to the fourth outer frame.

3. The display device of claim 2, wherein the first outer frame further comprises:

a vertical part extending along an edge of the first outer frame; and a horizontal part protruding from an inside of the vertical part in a direction intersecting the vertical part, wherein the third outer frame is coupled to one end of the horizontal part, and the fourth outer frame is coupled to the other end of the horizontal part.

4. The display device of claim 3, wherein:

the third outer frame and the fourth outer frame are symmetrical to each other with respect to the first outer frame; and the first guide frame and the second guide frame are symmetrical to each other with respect to the first outer frame.

5. The display device of claim 3, wherein the third outer frame further comprises:

a side part extending along an edge of the third outer frame;

a flat plate part protruding from an inside of the side part in a direction intersecting the side part; and a reinforcing part extending between the flat plate part and the side part in a direction intersecting the flat plate part and the side part, wherein a portion of the reinforcing part is coupled to the one end of the horizontal part.

6. The display device of claim 5, wherein the reinforcing part comprises a horizontal rib disposed parallel to the horizontal part, wherein the first guide frame is coupled to the horizontal rib, and a first gap is formed between the first guide frame and the side part.

7. The display device of claim 6, further comprising at least one of a guide member or a fastening member which is inserted into the first guide frame and the horizontal rib, wherein the guide member comprises a spring pin having elasticity and including one end and the other end which are spaced apart from each other in a circumferential direction of the guide member.

8. The display device of claim 1, wherein the outer frame further comprises a coupling part protruding from an inside of the outer frame toward a rear of the module cover, wherein the guide frame is disposed between the module cover and the coupling part and coupled to the module cover and the coupling part.

9. The display device of claim 8, wherein the module cover comprises:

a rigid part formed by being pressed from a front surface of the module cover toward a rear thereof; and a first fixing part protruding from the rigid part toward the guide frame, wherein the guide frame is disposed between the first fixing part and the coupling part and coupled to the first fixing part and the coupling part.

10. The display device of claim 9, wherein the module cover further comprises a second fixing part and a third fixing part which protrude from the rigid part toward the guide frame and are coupled to the guide frame, wherein:

the first fixing part is adjacent to an upper side of the module cover;

the third fixing part is adjacent to a lower side of the module cover; and the second fixing part is disposed between the first fixing part and the second fixing part.

11. The display device of claim 10, wherein the guide frame comprises:

a first part seated on the outer frame; and a second part formed by being pressed from the first part, and coupled to the first fixing part, the second fixing part, and the third fixing part.

12. The display device of claim 1, further comprising a supporter which surrounds a portion of the guide frame, and to which the cover assembly is coupled, wherein a portion of the supporter is disposed in a first gap between the guide frame and the outer frame, and the supporter is coupled to the guide frame to be movable in a longitudinal direction of the guide frame.

13. The display device of claim 12, wherein the supporter further comprises:

a first part which is disposed at a front of the guide frame, and to which the cover assembly is coupled;

a second part bent rearward from the first part and disposed in the first gap; and a third part bent from the second part toward a rear of the guide frame, wherein the third part is movably coupled to the guide frame.

14. The display device of claim 13, wherein the supporter comprises a slider provided on a surface of the third part that faces the first part, wherein a portion of the guide frame is disposed in a second gap between the first part and the third part, and the guide frame comprises a rail protruding from the guide frame toward the third part, and guiding movement of the slider.

15. The display device of claim 1, further comprising a lift assembly providing power to the cover assembly, wherein the cover assembly opens or closes at least a portion of a front surface of the display panel.

* * * * *